(12) United States Patent
Fujikawa

(10) Patent No.: US 9,690,149 B2
(45) Date of Patent: Jun. 27, 2017

(54) ACTIVE MATRIX SUBSTRATE AND DISPLAY DEVICE

(71) Applicant: Sharp Kabushiki Kaisha, Osaka-shi, Osaka (JP)

(72) Inventor: Yohsuke Fujikawa, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/917,296

(22) PCT Filed: Aug. 27, 2014

(86) PCT No.: PCT/JP2014/072468
§ 371 (c)(1),
(2) Date: Mar. 8, 2016

(87) PCT Pub. No.: WO2015/033840
PCT Pub. Date: Mar. 12, 2015

(65) Prior Publication Data
US 2016/0216548 A1    Jul. 28, 2016

(30) Foreign Application Priority Data

Sep. 9, 2013 (JP) ................................ 2013-186696

(51) Int. Cl.
| | | |
|---|---|---|
| G02F 1/1345 | (2006.01) | |
| G02F 1/1362 | (2006.01) | |
| H01L 27/02 | (2006.01) | |
| H01L 27/12 | (2006.01) | |
| G02F 1/1368 | (2006.01) | |

(52) U.S. Cl.
CPC ........ *G02F 1/13452* (2013.01); *G02F 1/1345* (2013.01); *G02F 1/1368* (2013.01); *G02F 1/136204* (2013.01); *G02F 1/136286* (2013.01); *H01L 27/0292* (2013.01); *H01L 27/1222* (2013.01); *H01L 27/1244* (2013.01)

(58) Field of Classification Search
CPC .......... G02F 1/136286; G02F 1/13452; G02F 1/1345; G02F 1/136204; G02F 1/1368; H01L 27/2397; H01L 27/3288; H01L 27/1222; H01L 27/0292; H01L 27/1244
See application file for complete search history.

(56) References Cited

U.S. PATENT DOCUMENTS

2012/0319144 A1* 12/2012 Fujikawa .............. G02F 1/1345
257/88

FOREIGN PATENT DOCUMENTS

| JP | 3010800 B2 | 2/2000 |
|---|---|---|
| JP | 2007-086474 A | 4/2007 |

* cited by examiner

*Primary Examiner* — Thanhha Pham
(74) *Attorney, Agent, or Firm* — Keating & Bennett, LLP

(57) ABSTRACT

Interconnects (34) include an inside interconnect section (40) and an outside interconnect section (41). The inside interconnect section (40) includes a first interconnect layer (42), a second interconnect layer (43), and a connection section (44) that connects the first interconnect layer (42) and the second interconnect layer (43). The outside interconnect section (41) includes a third interconnect layer (45). Of a plurality of interconnects (34), in one interconnect (X) of neighboring interconnects the second interconnect layer (43) and the third interconnect layer (45) are connected, and in another of the neighboring interconnects (Y), the first interconnect layer (42) and the third interconnect layer (45) are connected.

8 Claims, 23 Drawing Sheets

$L_1-L_1$ CROSS-SECTIONAL VIEW

FIG. 11
| | n-TH INTERCONNECT (INTERCONNECT X) | (n+1)TH INTERCONNECT (INTERCONNECT Y) |
|---|---|---|
| PATH α | 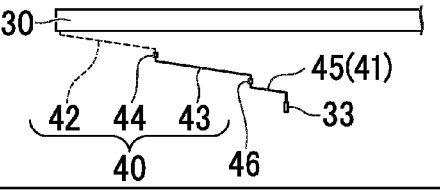 | 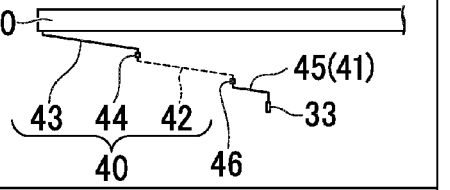 |
| PATH β | 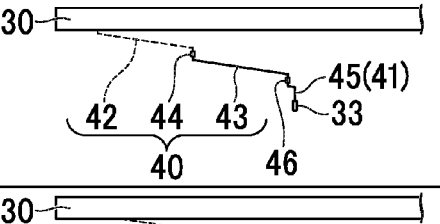 | 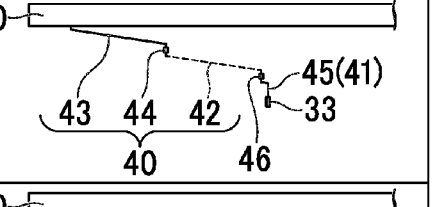 |
| PATH γ | 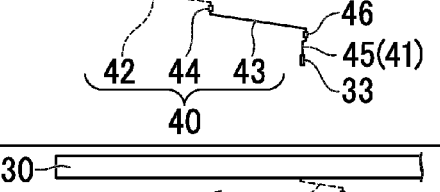 | 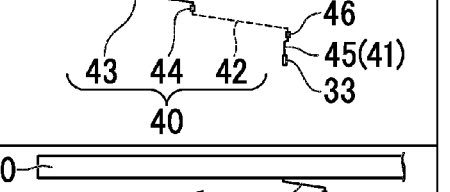 |
| PATH δ | 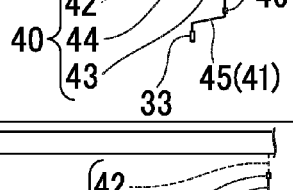 | 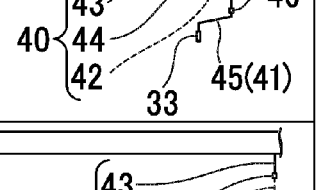 |
| PATH ε | 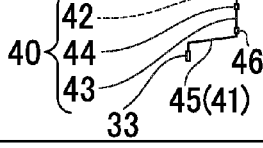 | 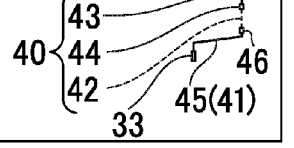 |
| REFERENCE PATH 1 | 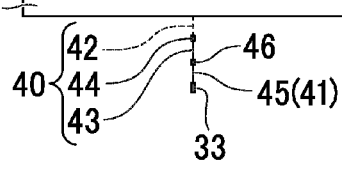 | 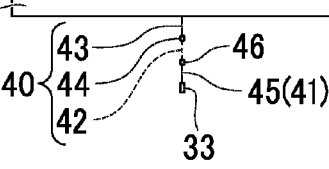 |
| REFERENCE PATH 2 | 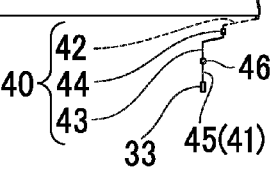 | 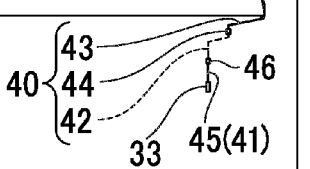 |

FIG. 21

| | n-TH INTERCONNECT (INTERCONNECT X') | (n+1)TH INTERCONNECT (INTERCONNECT Y') |
|---|---|---|
| PATH α' | 30, 142, 144, 143, 140, 146, 145(141), 133 | 30, 143, 144, 142, 140, 146, 145(141), 133 |
| PATH β' | 30, 142, 144, 143, 140, 146, 145(141), 133 | 30, 143, 144, 142, 140, 146, 145(141), 133 |
| PATH γ' | 30, 142, 144, 143, 140, 146, 145(141), 133 | 30, 143, 144, 142, 140, 146, 145(141), 133 |
| PATH δ' | 30, 140{142, 144, 143}, 146, 145(141), 133 | 30, 140{143, 144, 142}, 146, 145(141), 133 |
| PATH ε' | 30, 140{142, 144, 143}, 146, 145(141), 133 | 30, 140{143, 144, 142}, 146, 145(141), 133 |
| REFERENCE PATH 1' | 30, 140{142, 144, 143}, 146, 145(141), 133 | 30, 140{143, 144, 142}, 146, 145(141), 133 |
| REFERENCE PATH 2' | 30, 140{142, 144, 143}, 146, 145(141), 133 | 30, 140{143, 144, 142}, 146, 145(141), 133 |

ACTIVE MATRIX SUBSTRATE AND DISPLAY DEVICE

TECHNICAL FIELD

The present invention relates to an active matrix substrate and a display device.

The subject application claims priority based on the patent application No. 2013-186696 filed in Japan on Sep. 9, 2013 and incorporates by reference herein the content thereof.

BACKGROUND ART

Liquid crystal display devices have features such as thinness and light weight, and are widely used, for example, as monitors (display devices) in various electronic devices, such as liquid crystal TVs, personal computers, mobile telephones, digital cameras, portable terminals, and particularly in mobile devices and the like.

In recent years, liquid crystal display devices having a liquid crystal display panel that uses active matrix drive have occupied the mainstream. A liquid crystal display panel has an element substrate and an opposing substrate, which are disposed to be mutually opposing and a liquid crystal layer sandwiched between the element substrate and the opposing substrate.

Of these, the element substrate is known as an active matrix substrate. A plurality of pixel electrodes that serve as the unit pixels of an image display are arranged in matrix fashion on the surface of the element substrate opposite the liquid crystal layer, thereby forming a rectangular display area for displaying images. Switching elements such as thin-film transistors (TFTs) are connected to each pixel electrode. It is possible for the switching elements to switch the drive voltage applied to each pixel electrode on and off.

A plurality of column control lines (signal lines) and a plurality of row control lines (scanning lines) are arranged in the display area of the element substrate so as to mutually intersect. The pixel electrodes and the switching elements are provided corresponding to the intersections of the plurality of column control lines with the plurality of row control lines.

Column control circuits (signal line drive circuits) electrically connected to the plurality of column control lines and row control circuits (scanning line drive circuits) electrically connected to the plurality of row control lines are provided in the peripheral area of the element substrate display area (referred to as the peripheral circuit area).

On the outside of the peripheral circuit area a terminal area in which a plurality of terminals are arranged in a line along an edge part of the element substrate and an interconnect area in which a plurality of interconnects are arranged between display area and the terminal area are provided. The plurality of terminals are provided in correspondence to each of the plurality of column control lines and the plurality of row control lines. The plurality of interconnects are arranged between the plurality of column control lines, and plurality of row control lines, and the plurality of terminals.

If column control circuits and row control circuits, which are described later, are formed monolithically, there are cases in which either interconnects directly leading out from the column control lines to the terminals or interconnects directly leading out from the row control lines to the terminals do not exist. Typically, the preferable application is a constitution in which row control circuits are monolithically formed and interconnects are lead out from the column control lines to the terminals.

Recently, there has been an increasing requirement for liquid crystal display panels that have higher resolution and are smaller. To meet this type of requirement, in an active matrix substrate, the area outside of the display area (called the frame) has been narrowed (by what is called frame narrowing).

Specifically, in an active matrix substrate, in order to meet such a requirement for frame narrowing, the column control circuits and row control circuits are simultaneously formed on the substrate (monolithically) as a base material of low-temperature polysilicon.

In an active matrix substrate, compared to the area occupied by the monolithic column control circuits and row control circuits and the like, the area occupied by the large number of interconnects that are led through the interconnect area is large, making it difficult to reduce the size of the interconnect area to accommodate frame narrowing. For this reason, in a conventional active matrix substrate, in order to accommodate frame narrowing, measures have been taken with regard to the width, the spacing, and the arrangement of the interconnects (refer to, for example, Patent References 1 and 2).

CITATION LIST

Patent Document

[PATENT DOCUMENT 1] Japanese Patent No. 3010800
[PATENT DOCUMENT 2] Japanese Patent Application Publication No. 2007-86474

DISCLOSURE OF THE INVENTION

Problems to be Solved by the Invention

A plurality of interconnects are arranged from the display area side toward the terminal area side so as to form a narrowing fan shape (with the interconnect pitch narrowing). This causes there to be disparity in the lengths of the interconnects that are arranged.

The shortest of the plurality of interconnects tend to be subject to circuit breakdown by ESD (electrostatic discharge). In a conventional active matrix substrate, protective circuitry including transistors, diodes, and the like has been disposed in the interconnect area to prevent this.

However, because the protective circuitry occupies a large surface area within the interconnect area, it was one cause of an increase in the size of the frame. Also, if the interconnect area is made smaller in order to achieve frame narrowing in an active matrix substrate, the interconnect length is further shortened, leading to the problem of making it even more difficult to omit the protective circuitry.

One aspect of the present invention, which has been proposed in consideration of the above-noted conventional situation, has as an object to provide an active matrix substrate and a display device that uses that active matrix substrate, which not only achieves frame narrowing, but also does not require protective circuitry for at least one of the interconnects arranged between the column control lines and the terminals and the interconnects arranged between the row control lines and the terminals.

Means for Solving the Problems

To achieve the above-noted object, an active matrix substrate according to one aspect of the present invention has, on a substrate, a plurality of column control lines and a plurality of row control lines arranged in directions so as to mutually intersect, a plurality of switching elements provided so as to correspond to the intersections of the plurality of column control lines with the plurality of row control lines, a plurality of pixel electrodes connected to each of the plurality of switching elements, a plurality of terminals provided so as to correspond to at least one of the plurality of column control lines and the plurality of row control lines, and a plurality of interconnects each arranged between the plurality of column control lines or the plurality of row control lines and the plurality of terminals. A display area in which a plurality of pixel electrodes are arranged in matrix fashion, a terminal area in which a plurality of terminals are arranged in a line along an edge part of the substrate, and an interconnect area in which a plurality of interconnects are arranged between the display area and the terminal area are provided within the surface of the substrate. Each of the plurality of interconnects has an inside interconnect section that is arranged on the display area side within the interconnect area and an outside interconnect section that is arranged on the terminal area side within the interconnect area. Additionally, at least a part of the inside interconnect section is arranged so that the interconnect pitch becomes narrower moving from the display area side toward the terminal area side, and the outside interconnect section is arranged so that the interconnect pitch of the outside interconnect section becoming smaller moving from the display area side toward the terminal area side. The inside interconnect section includes a first interconnect layer having a first sheet resistance, a second interconnect layer having a second sheet resistance that is higher than the first sheet resistance, and a connection section that connects the first interconnect layer and the second interconnect layer. The outside interconnect section includes a third interconnect layer connected to either the first interconnect layer or the second interconnect layer. Of the plurality of interconnects, the second interconnect layer and the third interconnect layer are connected to one neighboring interconnect, and the first interconnect layer and the third interconnect layer are connected to the other neighboring interconnect.

In the above-noted active matrix substrate, of the plurality of interconnects, by making the disposition of the first interconnect layer and the second interconnect layer constituting the inside interconnect section different between one neighboring interconnect and the other neighboring interconnect, it is possible to narrow the interconnect pitch of the inside interconnect section. Also, because the inside interconnect section includes a second interconnect layer having a sheet resistance higher than that of the first interconnect layer, the interconnect resistance obtained by lengthening the second interconnect layer can be used as a protective resistance with respect to electrostatic discharge, thereby enabling an active matrix substrate that not only achieves frame narrowing in the interconnect area but also does not require a protective circuit.

The constitution may be one in which the connection section is provided at a position such that the lengths of the first interconnect layer and the second interconnect layer are equal.

This constitution enables the difference in the sheet resistance between one and another of neighboring interconnects of the plurality of interconnects to be made small.

The constitution may be one in which the plurality of interconnects include a first interconnect group arranged so that the interconnect pitch shortens moving from the display area side toward the terminal area side and a second interconnect group that is neighboring to the first interconnect group and that is arranged so that the interconnect pitch shortens moving from the display area side toward the terminal area side.

This constitution achieves frame narrowing in the interconnect area, without disposing protective circuitry in the first and second interconnect groups. A constitution in which a plurality of interconnect groups are provided that include a first interconnect group and a second interconnect group is suitable for a large, high-resolution display device. In general, when a display is made larger and has high resolution, the frame becomes large. It is therefore possible to preferably adopt this constitution for frame narrowing in such display devices.

The constitution may be one in which the shortest of a plurality of interconnects has an inside interconnect section that includes a first interconnect layer or a second interconnect layer extending in a direction perpendicular to the direction of arrangement of a plurality of terminals and an outside interconnect section that includes a third interconnect layer extending in a direction at an inclination with respect to the direction of arrangement of the plurality of terminals.

The above-noted constitution enables lengthening of an interconnect layer having a high sheet resistance, and the interconnect resistance thus obtained can be used as a protective resistance with respect to electrostatic discharge, thereby enabling narrowing of the interconnect area without providing protective circuitry.

The third interconnect layer may have the second sheet resistance.

The above-noted constitution enables formation of the third interconnect layer and the second interconnect layer as the same interconnect layer. Also, the interconnect resistance obtained by lengthening the third interconnect layer can be used as a protective resistance with respect to electrostatic discharge.

The constitution may be one in which the inside interconnect section is constituted to have a first interconnect layer that is higher than a second interconnect layer, and in which a plurality of interconnects, when the substrate is seen in plan view, are disposed so that, between one interconnect and another interconnect, a first interconnect layer constituting at least a part of the inside interconnect section overlaps with the neighboring second interconnect layer.

The above-noted constitution enables narrowing of the interconnect pitch of the inside interconnect section and the achievement of frame narrowing of the interconnect area.

The constitution may be one in which the plurality of interconnects are constituted so that, when the substrate is viewed in plan view, the first interconnect layer is disposed so as to overlap with the neighboring second interconnect layer, so that the number of interconnects in the inside interconnect sections is smaller than the number interconnects in the outside interconnect sections.

By reducing the apparent number of interconnects, the above-noted constitution enables a further frame narrowing of the interconnect area.

A display device according to one aspect of the present invention has one of the active matrix substrates noted above.

In the above-noted display device, by using an active matrix substrate that can achieve frame narrowing and does not require protective circuitry, it is possible to accommodate a further increased resolution and reduction in size.

Effects of the Invention

The above-noted aspects enable the provision of an active matrix substrate and a display device using such an active matrix substrate, which not only achieve frame narrowing, but also do not require protective circuitry for at least one of the interconnects arranged between column control lines and terminals and the interconnects arranged between the row control lines and the terminals.

BRIEF DESCRIPTION OF THE DRAWINGS

FIG. 11 is a set of plan views showing the plurality of interconnects shown in FIG. 10, classified by path.

FIG. 21 is a set of plan views showing the plurality of interconnect shown in FIG. 20, classified by path.

MODE FOR CARRYING OUT THE INVENTION

Figure 1:
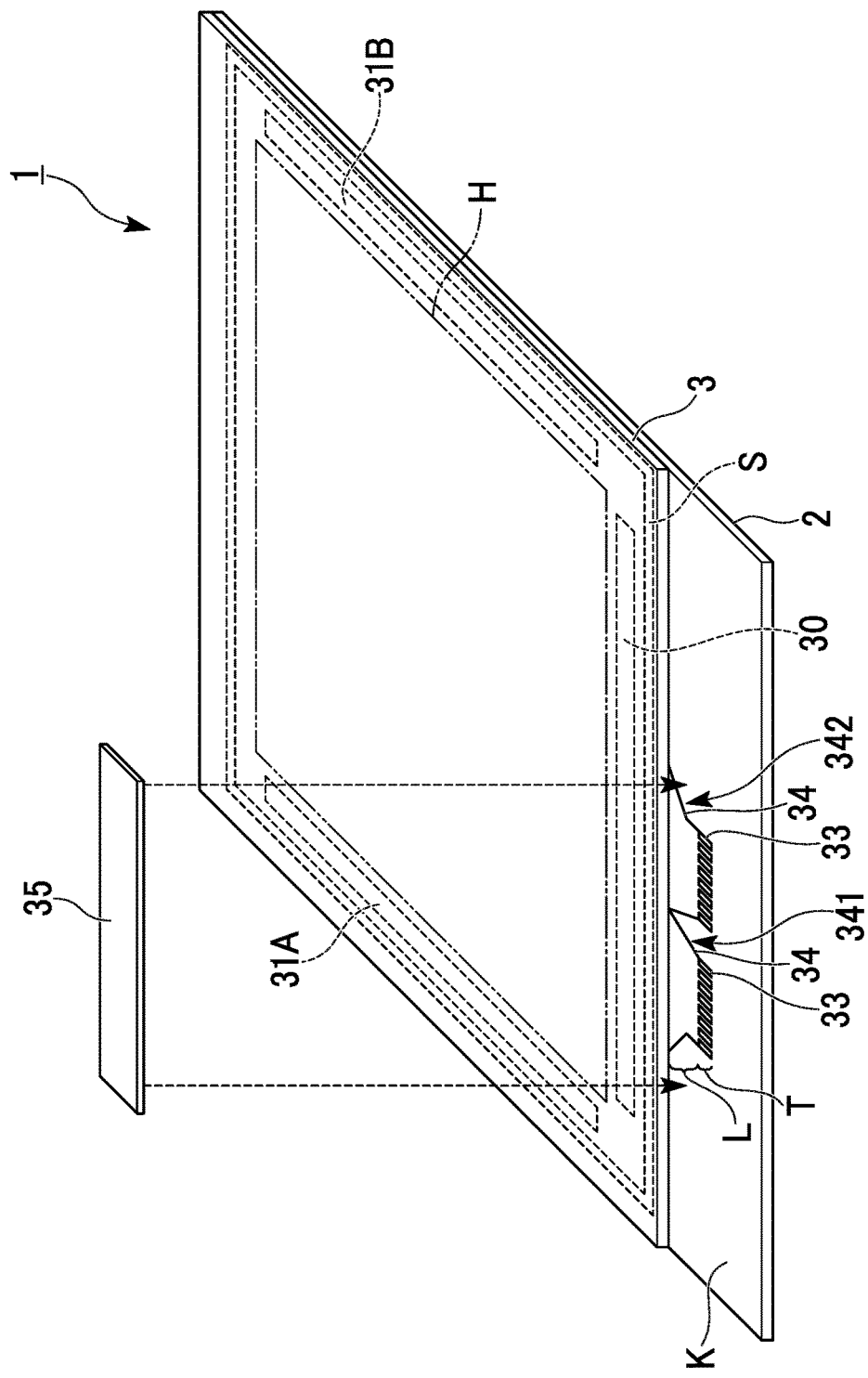
FIG. 1 is an oblique view showing the constitution of a liquid crystal display panel according to an embodiment of the present invention.

Embodiments of the present invention will be described below, with references made to the drawings.

In the drawings used below, in order to make various elements easy to see, some constituent elements are shown in different scales.

First Embodiment (Liquid Crystal Display Device)

First, a liquid crystal display device having a liquid crystal display panel 1 shown in, for example, FIG. 1 to FIG. 3 will be described as an active matrix substrate and display device having that active matrix substrate according to the first embodiment of the present invention.

FIG. 1 is an oblique view showing the general constitution of a liquid crystal display panel 1. FIG. 2 is a cross-sectional view showing the cross-sectional structure of the liquid crystal display panel 1. FIG. 3 is a schematic view showing the circuit constitution of the liquid crystal display panel 1.

Figure 2:
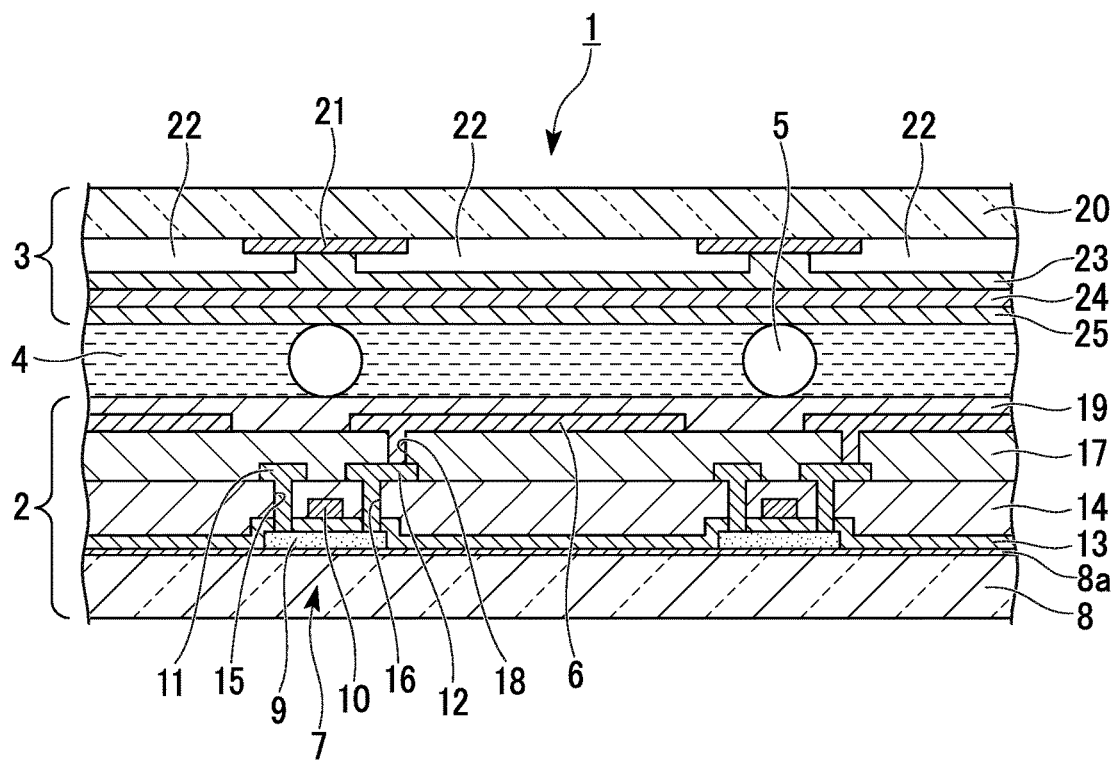
FIG. 2 is a cross-sectional view showing the cross-sectional structure of the liquid crystal display panel shown in FIG. 1.

As shown in FIG. 1 and FIG. 2, the liquid crystal display panel 1 has an element substrate 2, an opposing substrate 3 disposed to as to oppose the element substrate 2, and a liquid crystal layer 4 disposed between the element substrate 2 and the opposing substrate 3.

The liquid crystal layer 4 is sealed by sealing the periphery between the element substrate 2 and the opposing substrate 3 using sealing material S that provides a rectangular frame, into which liquid crystal is injected, thereby being sandwiched between the element substrate 2 and the opposing substrate 3. Spherical spacers 5 are disposed between the element substrate 2 and the opposing substrate 3 to maintain a uniform spacing therebetween.

The element substrate 2 is referred as an active matrix substrate (and is also known as a TFT substrate or an array substrate). On the surface of the element substrate 2 that opposes the liquid crystal layer 4 is formed a matrix arrangement of a plurality of pixel electrodes 6 which serve as the unit pixels of an image display, thereby forming a rectangular display area H for displaying images.

At each pixel electrode 6 is connected a switching element 7 such as a thin-film transistor (TFT). In the liquid crystal display panel 1, it is possible to switch the drive voltage applied to each of the pixel electrodes 6 on and off by using these switching elements 7.

Specifically, the element substrate 2 has, on the surface of the side that opposes the liquid crystal layer 4, a first substrate 8 on which are formed a plurality of pixel electrodes 6 and a plurality of switching elements 7. The first substrate 8 can be made using a material that is transparent to light, such as glass. An underfilm 8a is formed on the first substrate 8, covering the surface on the liquid crystal layer 4 side. On the surface on the liquid crystal layer 4 side of the first substrate 8 is formed a TFT (switching element) 7 that includes a semiconductor layer 9, a gate electrode 10, a source electrode 11, and a drain electrode 12. Although the present embodiment is described regarding a constitution in which a top-gate TFT shown in FIG. 2 is used as the switching element 7, a constitution can be adopted in which a bottom-gate TFT is used.

Semiconductor materials such as CGS (continuous grain silicon), LPS (low-temperature polysilicon), or α-Si (amorphous silicon) can be used as the semiconductor layer 9.

An oxide semiconductor can also be used as the semiconductor layer 9. A semiconductor of In—Ga—Zn—O, for example, which is an oxide that includes indium (In), gallium (Ga), and zinc (Zn), can be used as the oxide semiconductor. A TFT made using an In—Ga—Zn—O based semiconductor has a high mobility (more than 20 times that of an α-Si TFT) and a low leakage current (less than 1/100 that of an α-Si TFT). It is therefore possible to greatly reduce the power consumption of the liquid crystal display panel 1.

In addition to an In—Ga—Zn—O based semiconductor, for example, a Zn—O based semiconductor, an In—Zn—O based semiconductor, a Zn—Ti—O based semiconductor, a Cd—Ge—O based semiconductor, a Cd—Pb—O based semiconductor, cadmium oxide (CdO), an Mg—Zn—O based semiconductor, an In—Sn—Zn—O based semiconductor (for example $In_2O_3$—$SnO_2$—ZnO), or an In—Ga—Sn—O based semiconductor can be used as the oxide semiconductor.

A gate insulating film 13 is formed on the first substrate 8 so as to cover the semiconductor layer 9. The gate insulating film 13 can be made using, for example, a silicon oxide film, a silicon nitride film, or a laminated film thereof. A gate electrode 10 is formed on the gate insulating film 13 so as to oppose the semiconductor layer 9. A laminated film of W (tungsten)/TaN (tantalum nitride), Mo (molybden), Ti (titanium), or Al (aluminum) or the like can be used for the gate electrode 10.

An interlayer insulating film 14 is formed on the gate electrode film 13 so as to cover the gate electrode 10. The interlayer insulating film 14 can be made of, for example, a silicon oxide film, a silicon nitride film, or a laminated film thereof.

A source electrode 11 and a drain electrode 12 are formed on the interlayer insulating film 14. The source electrode 11 is connected to a source region of the semiconductor layer 9 via a contact hole 15 passing through the interlayer insulating film 14 and the gate insulating film 13. In the same manner, the drain electrode 12 is connected to a drain region of the semiconductor layer 9 via a contact hole 16 passing through the interlayer insulating film 14 and the gate insulating film 13. The source electrode 11 and the drain electrode 12 can be made of, for example, a material having the same type of conductivity as the gate electrode 10.

A protective film 17 is formed on the interlayer insulating film 14 so as to cover the source electrode 11 and the drain electrode 12. The same type of material as the interlayer insulating film 14 or an organic insulating material can be used as the material of the protective film 17.

A pixel electrode 6 is formed on the protective film 17. The pixel electrode 6 is connected to the drain electrode 12 via a contact hole 18 passing through the protective film 17. That is, the pixel electrode 6 is connected to the drain region of the semiconductor layer 9 with the drain electrode 12 serving as a relay electrode. A transparent electrically conductive material such as ITO (indium tin oxide), IZO (indium zinc oxide) or the like can be used for the pixel electrode 6.

An orientation film 19 is formed over the entire surface of the protective film 17 so as to cover the pixel electrode 6. The orientation film 19 has an orientation controlling force that orients the liquid crystal molecules of the liquid crystal layer 4.

The opposing substrate 3 is known as a color filter substrate. Specifically, the opposing substrate 3 has a second substrate 20 that is smaller than the first substrate 8. A transparent base material such as glass can be used as the second substrate 20.

A black matrix layer 21, a color filter layer 22, a planarization layer 23, an opposing electrode 24, and an orientation film 25 are sequentially formed on the liquid crystal layer 4 side of the second substrate 20. The black matrix layer 21 functions as a light-blocking layer blocking light between regions corresponding to each pixel within the display area H. A metal film of, for example, Cr (chromium) or a Cr/chromium oxide multilayer film or a photoresist film or the like into which carbon particles are dispersed in a photosensitive resin can be used as the black matrix film 21.

The color filter layer 22 has a structure in which color filters including a dye corresponding to red (R), green (G), and blue (B) are periodically arranged. That is, a color filter layer 22 is disposed that includes any one color filter of R, G, and B in a region corresponding to one pixel. The color filter layer 22 may have a constitution that has more than the three colors R, G, and B.

The planarization layer 23 is formed by an insulating film covering the black matrix layer 21 and the color filter layer 22. The planarization layer 23 has the function of smoothing and planarizing the stepped parts formed by the black matrix layer 21 and the color filter 22.

The opposing electrode 24 is formed on the planarization layer 23. A transparent electrically conductive material the same as that of the pixel electrodes 6 can be used as the opposing electrode 24. The orientation film 25 is formed on the opposing electrode 24 over the entire surface, so as to cover the opposing electrode 24. The orientation film 25 has an orientation controlling force that orients the liquid crystal molecules of the liquid crystal layer 4.

Figure 3:
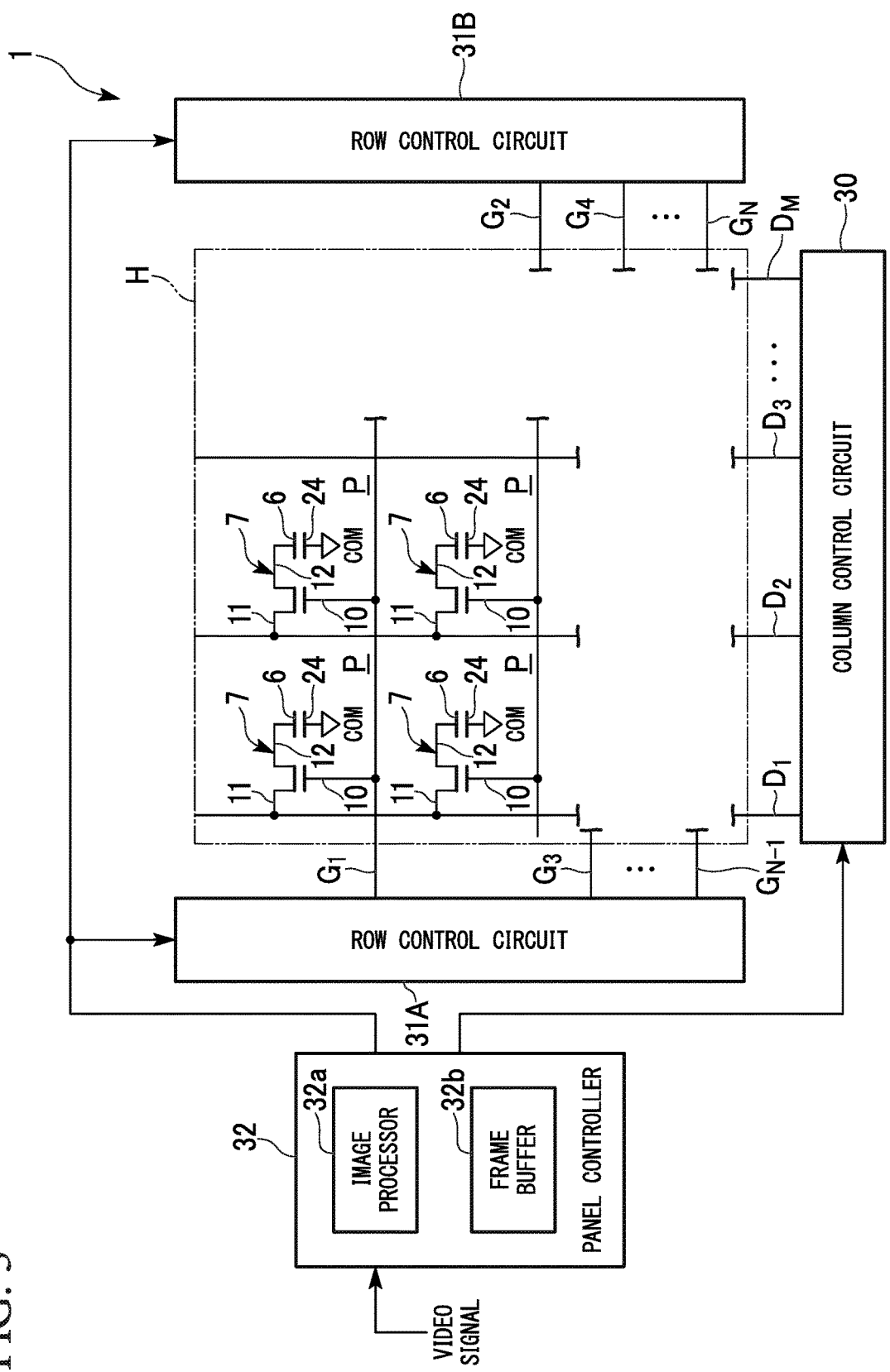
FIG. 3 is a schematic view showing the circuit constitution of the liquid crystal display panel shown in FIG. 1.

As shown in FIG. 1 and FIG. 3, a plurality of column control lines $D_1, D_2, \ldots, D_M$ and a plurality of row control lines $G_1, G_2, \ldots, G_N$ are arranged in the display area H of the element substrate 2 in directions that mutually intersect. That is, the plurality of column control lines $D_1, D_2, \ldots, D_M$ extend in the vertical direction (row direction) in FIG. 3 and are arranged in parallel in the horizontal direction (column direction) in FIG. 3. In contrast, the plurality of row control lines $G_1, G_2, \ldots, G_N$ extend in the horizontal direction (column direction) in FIG. 3 and are arranged in parallel in the vertical direction (row direction) in FIG. 3.

The plurality of column control lines $D_1, D_2, \ldots, D_M$ and the plurality of row control lines $G_1, G_2, \ldots, G_N$ need not be mutually perpendicular, and may intersect at an angle other than 90°.

The pixel electrodes 6 and the switching elements 7 are provided so as to correspond to each of the intersections between the plurality of column control lines $D_1, D_2, \ldots, D_M$ and the plurality of row control lines $G_1, G_2, \ldots, G_N$. That is, the plurality of column control lines $D_1, D_2, \ldots, D_M$ and the plurality of row control lines $G_1, G_2, \ldots, G_N$ delineate matrix intersections corresponding to the pixels P within the surface of the display area H. The pixel electrodes 6 and the switching elements 7 are provided one each in correspondence to each pixel P.

The plurality of column control lines $D_1, D_2, \ldots, D_M$, by being electrically connected to the source electrode 11 of each switching element (TFT) 7, constitute signal lines (source bus lines) that supply an image signal to the source electrodes 11. The plurality of row control lines $G_1, G_2, \ldots, G_N$, by being electrically connected to the gate electrode 10 of each switching element (TFT) 7, constitute scanning lines (gate bus lines) that supply scanning signals to the gate electrode 10. The plurality of pixel electrodes 6 are electrically connected to the drain electrode 12 of each switching element (TFT) 7. The opposing electrode 24 serves as a common electrode opposing each of the pixel electrodes 6, with the liquid crystal layer 4 therebetween, and the opposing electrode 24 is electrically connected to the common electrode line COM. Although it is not illustrated, there is often a storage capacitance provided in parallel with the capacitance of the liquid crystal layer 4 (not shown).

With the above-noted constitution, when scanning signals are supplied to the gate electrodes 10 via the row control lines $G_1, G_2, \ldots, G_N$, the switching elements 7 go into the on state in each pixel P. At a pixel P for which the switching element 7 is in the on state, if an image signal is supplied to the source electrode 11 via the column control lines $D_1, D_2, \ldots, D_M$, the image signal is supplied to the pixel electrodes 6 via the drain electrode 12.

The column control circuit 30 and a pair of row control circuits 31A and 31B are provided in the area surrounding the display area H of the element substrate 2 (referred to as the peripheral circuit area).

The column control circuit 30 is disposed at the lower side of the display area H of the element substrate 2, along the arrangement direction (column direction) of the plurality of column control lines $D_1, D_2, \ldots, D_M$. One end of each of the plurality of column control lines $D_1, D_2, \ldots, D_M$ is connected to the column control circuit 30.

As a signal line drive circuit (source driver), the column control circuit 30, functions as a switching circuit (referred to also as an RGB switching circuit) that distributes a signal given from one interconnect to three column control lines with a prescribed timing. The column control circuit 30, by functioning in this manner, supplies image signals to the plurality of column control lines $D_1, D_2, \ldots, D_M$.

The pair of row control circuits 31A and 31B are disposed along the arrangement direction (row direction) of the plurality of row control lines $G_1, G_2, \ldots, G_N$ so as to sandwich the display area H of the element substrate 2 on the left and the right thereof. The row control circuit 31A on one side (the left side in FIG. 3) has electrically connected thereto one end (the left end) of neighboring row control lines $G_1, G_3, \ldots, G_{N-1}$ of that side (for example, odd numbers), while the row control circuit 31B on the other side (the right side in FIG. 3) has connected thereto the other end (the right end) of neighboring row control lines $G_2, G_4, \ldots, G_N$ of the other side (for example, even numbers).

The row control circuits 31A and 31B, as scanning line driver circuits (gate drivers), function as a sequential feeding circuit that select the row control lines in the sequence $G_1, G_2, \ldots, G_N$. By this function, the row control circuits 31A and 31B supply the scanning signals to the plurality of row control lines $G_1, G_2, \ldots, G_N$.

The column control circuit 30 and the row control circuits 31A and 31B include a plurality of thin-film transistors (TFTs) and are formed monolithically on the surface of the element substrate 2 opposing the liquid crystal layer 4, for example, with polysilicon as a base. The column control circuit 30 and the row control circuits 31A and 31B are disposed on the inside of a region surrounded by the sealing material S, or at a location that overlaps with the sealing material S when seen in plan view. Because the TFTs constituting the column control circuit 30 and the row control circuits 31A and 31B have the same basic constitution as the TFTs constituting the switching elements 7, the description thereof will be omitted.

The column control circuit 30 and the row control circuits 31A and 31B are electrically connected to an external panel controller 32. The panel controller 32 includes an image processor 32a and a frame buffer 32b. The image processor 32a, based on a video signal input from outside the liquid crystal display panel 1, supplies to the column control circuit 30 and the row control circuits 31A and 31B a control signal for displaying an image on the liquid crystal display panel 1. The frame buffer 32b stores display data for one frame that is included in the video signal.

A terminal area T in which a plurality of terminals 33 are linearly arranged along the edge part of the element substrate 2 and an interconnect area L in which a plurality of interconnects 34 are arranged between the display area H and the terminal area T are provided outside the peripheral circuit area.

A plurality of terminals 33 are provided in individual correspondence to the plurality of column control lines $D_1, D_2, \ldots, D_M$. An external driver IC 35 is connected to the plurality of terminals 33. The arrangement direction of the plurality of terminals 33 is in parallel with one side (lower side) of the display area H that is in opposition to the plurality of terminals 33.

In this case, the element substrate 2 is larger than the opposing substrate 3, and the element substrate 2 and the opposing substrate 3 are attached to one another by the sealing material S disposed along the peripheral edge of the opposing substrate 3. For this reason, on the surface of the element substrate 2 opposing the liquid crystal layer 4, outside of the region surrounded by the sealing material S, there is an area K provided in which the element substrate 2 extends to the outside from the opposing substrate 3 (referred to as the extending area). The plurality of terminals 33 are disposed along one edge part of the element substrate 2 in which the extending area K is provided.

An optional protective film 17 may be or may not be provided in the extending area K. For example, if the protective film 17 is made of a resin, fragments of resin might easily fly away due to damage, thereby presenting problems in process control. In such a case, the protective film 17 may be removed from the extending area K and the constitution may be made one in which the extending area K is protected by only the interlayer insulating film 14.

A plurality of interconnects 34 are arranged between the column control circuit 30 and each of the plurality of terminals 33. The plurality of interconnects 34 are disposed so as to be divided into a first interconnect group 341 and a second interconnect group 342, which symmetrically sandwich the center part in the arrangement direction thereof (row direction). The first interconnect group 341 and the second interconnect group 342 are arranged so that they form a narrowing fan-in shape (with the interconnect pitch becoming shorter) going from the column control circuit 30 side to the terminal 33 side.

Although they are not illustrated, a pair of polarizing films (polarizing sheets) is disposed on the front side and the rear side of a liquid crystal display panel 1 having the constitution as noted above. An optical film (optical member) such as a phase difference film or light-diffusing film is disposed as necessary on the front side of the liquid crystal display panel 1. Additionally, a liquid crystal display device is constituted by combining the liquid crystal display panel 1 with an illumination device such as a backlight that illuminates from the back side of the liquid crystal display panel 1.

In the liquid crystal display device, the white illumination light shined from the backlight is caused to strike the liquid crystal display panel 1 from the element substrate 2 side. A color image can be displayed by the red light, green light, and blue light exiting from the opposing substrate 3 side of the liquid crystal display panel 1.

Although the present embodiment shows an example in which a transmission-type liquid crystal display panel 1 is used, the liquid crystal display panel is not restricted to being such a transmission type, and can be a semi-transmission type (transmission/reflection type) or a reflective type.

Although there is no particular restriction with regard to the driving method for the liquid crystal display panel 1, a VA (vertical alignment) mode, a TN (twisted nematic) mode, a STN (super twisted nematic) mode, an IPS (in-plane switching) mode, or an FFS (fringe field switching mode) or the like can be adopted. A liquid crystal material having negative dielectric constant anisotropy or a liquid crystal material having positive dielectric constant anisotropy can be used for the liquid crystal layer 4, to suit these driving methods.

(Active Matrix Substrate)

<Basic Interconnect Constitution>

Next, as a characteristic part of the active matrix substrate to which the present invention is applied, the basic constitution of the interconnects 34 disposed in the interconnect area L of the above-noted element substrate 2 will be described, with references made to FIG. 4 to FIG. 9. In the basic constitution of the interconnects 34 shown in FIG. 4 to FIG. 9, the description will be for a simplification of the plurality of interconnects 34 as parallel straight lines.

Figure 4:
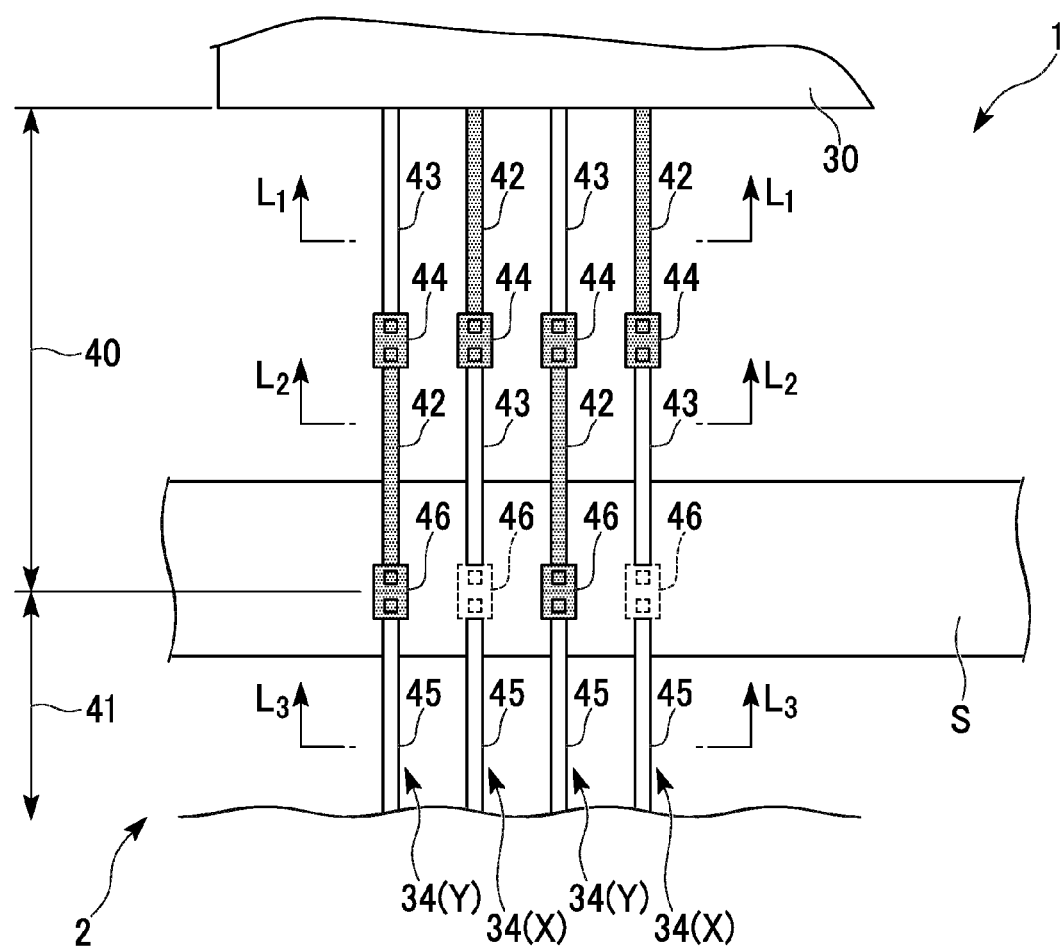
FIG. 4 is an enlarged plan view showing the main part of the interconnect area of a liquid crystal display panel that is a first embodiment.
Figure 5:
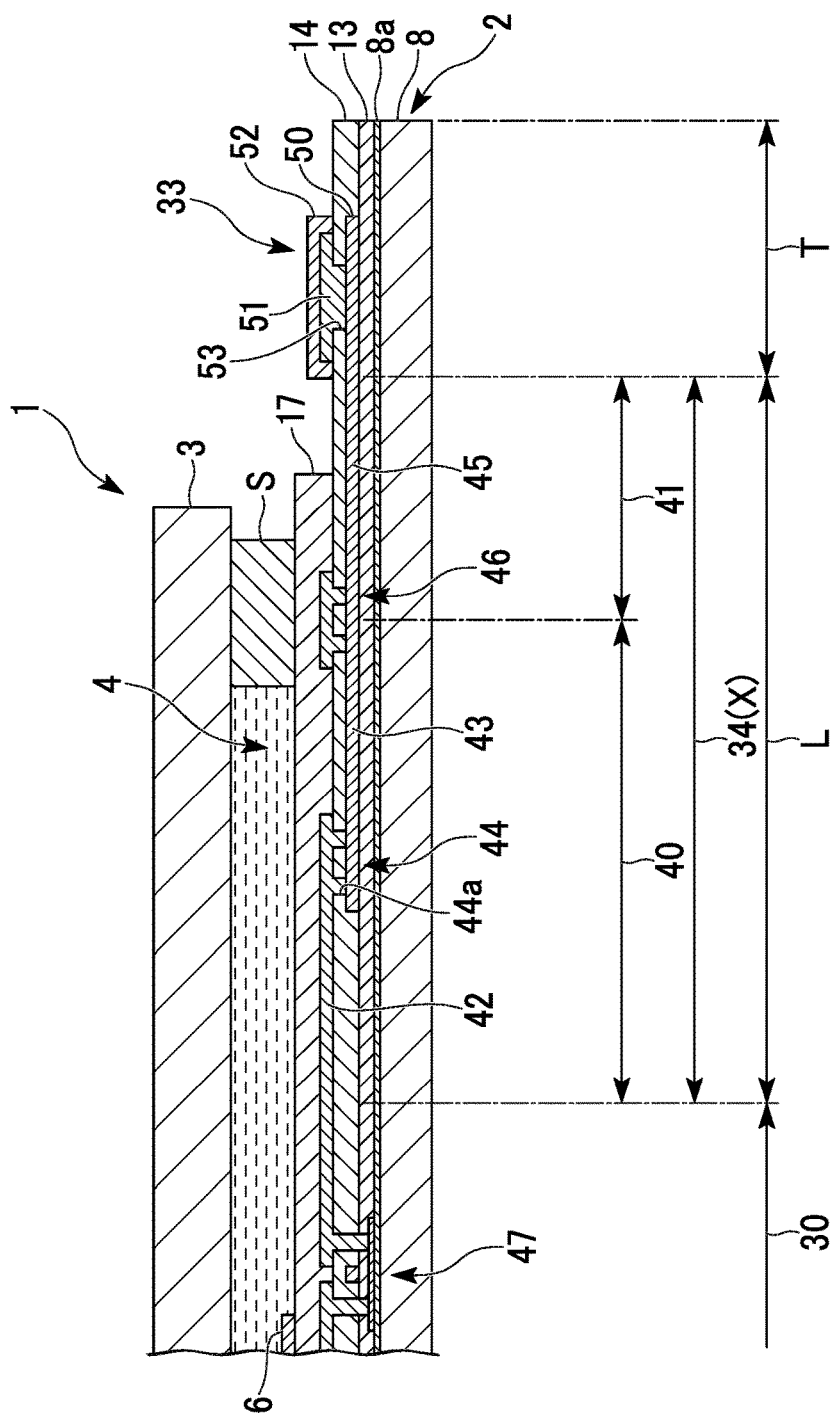
FIG. 5 is a cross-sectional view showing the main part of a liquid crystal display panel along the longitudinal direction of one of the interconnects shown in FIG. 4.
Figure 6:
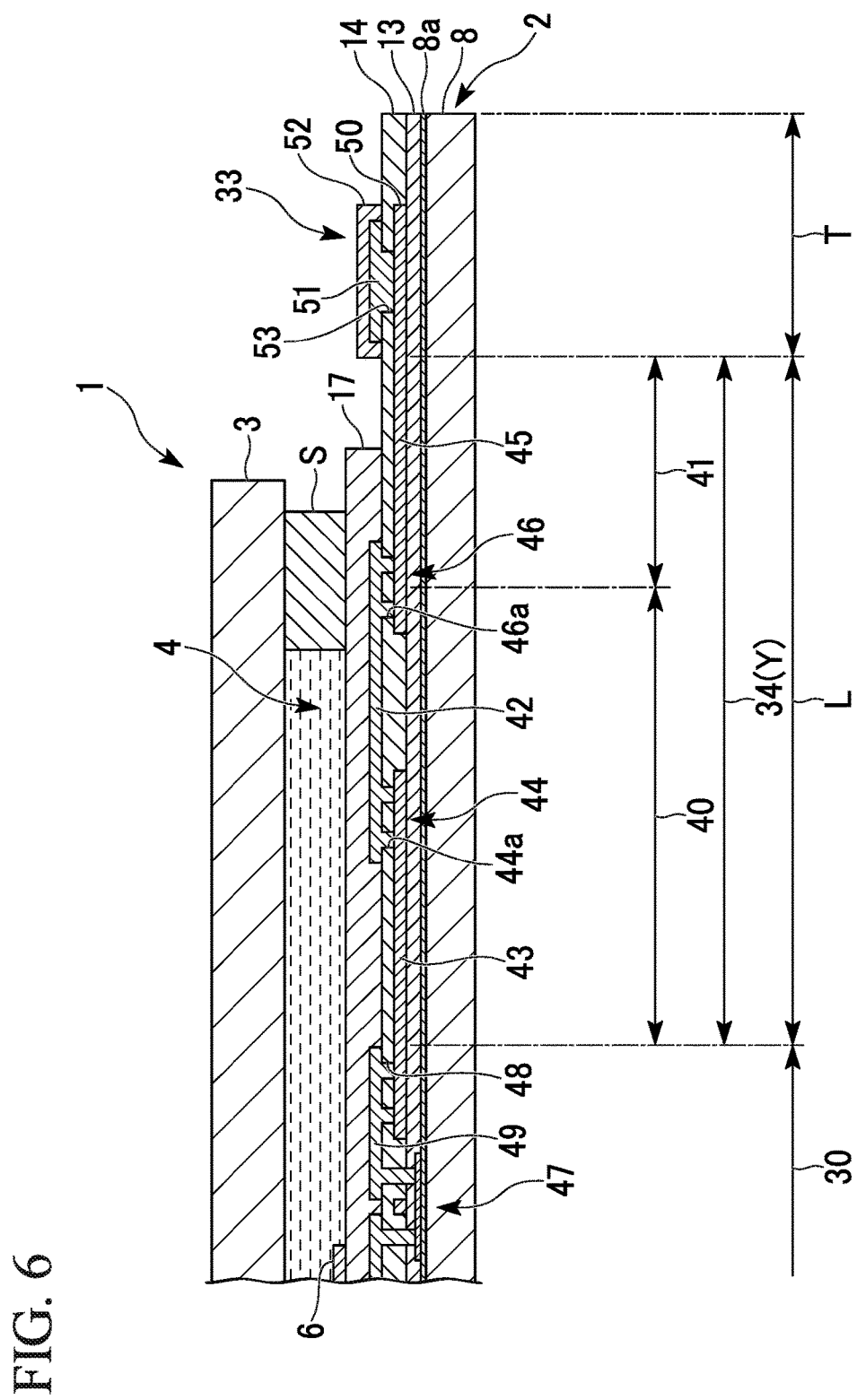
FIG. 6 is a cross-sectional view showing the main part of a liquid crystal display panel along the longitudinal direction of the other interconnect shown in FIG. 4.
Figure 7:
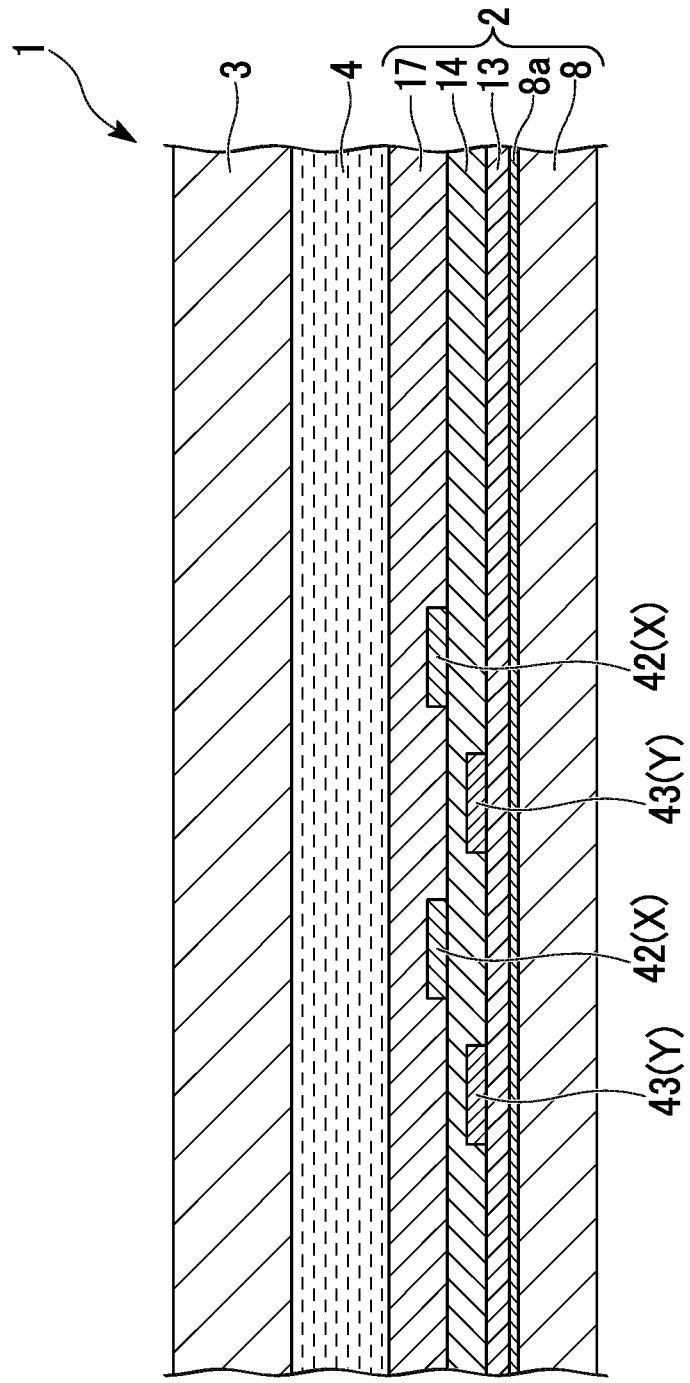
FIG. 7 is a cross-sectional view of the liquid crystal display panel shown in FIG. 4, along the cutting line $L_1$-$L_1$.
Figure 8:
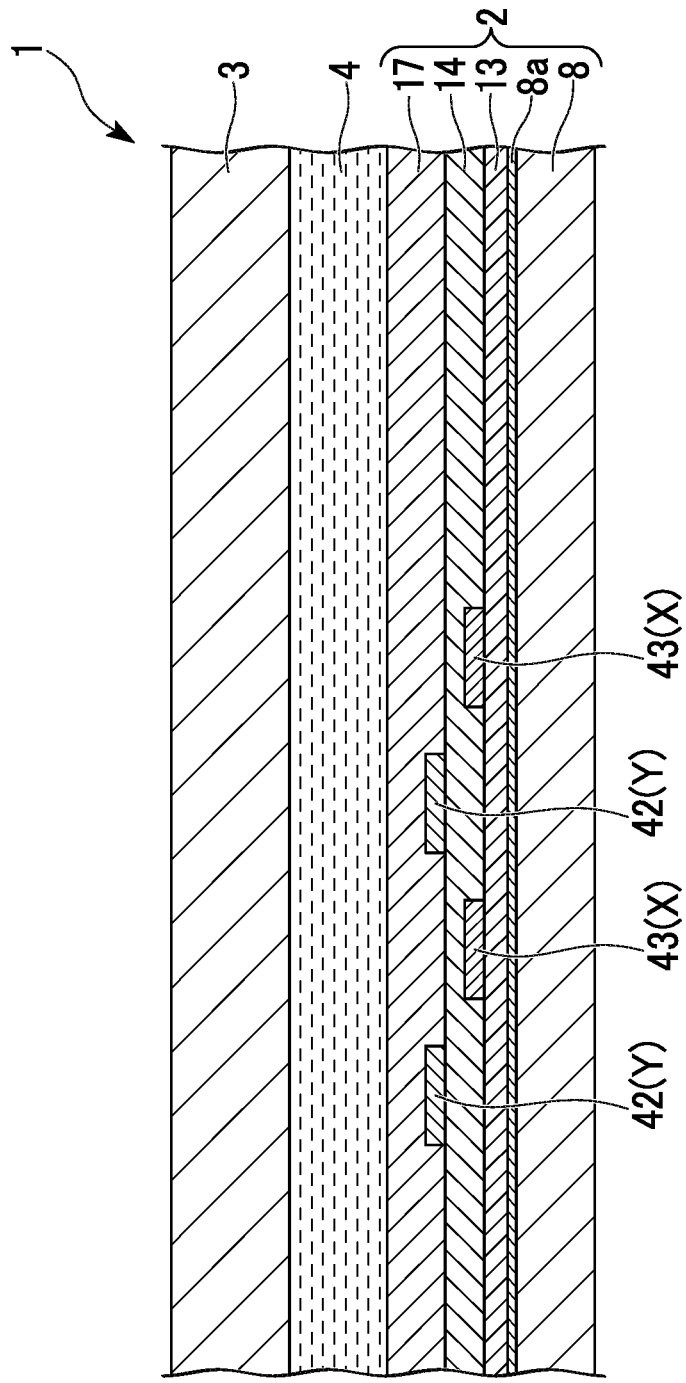
FIG. 8 is a cross-sectional view of the liquid crystal display panel shown in FIG. 4, along the cutting line $L_2$-$L_2$.
Figure 9:
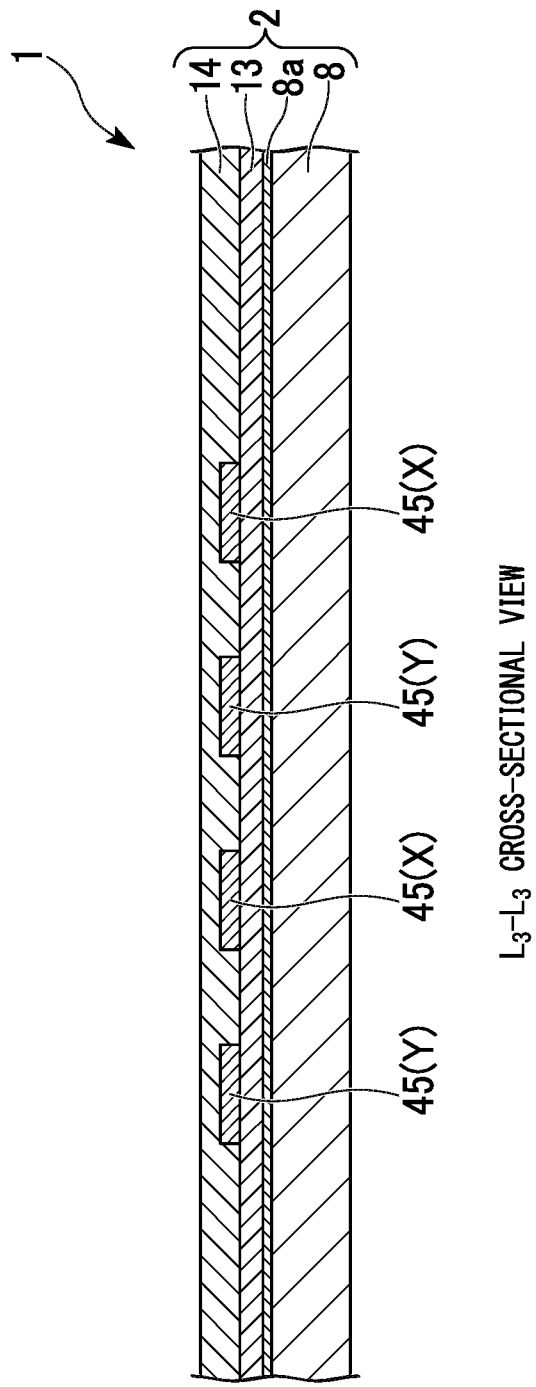
FIG. 9 is a cross-sectional view of the liquid crystal display panel shown in FIG. 4, along the cutting line $L_3$-$L_3$.

FIG. 4 is a plan view showing in enlarged form the main part of the interconnect area L of the liquid crystal display panel 1. FIG. 5 is a cross-sectional view of the main part of the liquid crystal display panel 1 along the longitudinal direction of one interconnect X shown in FIG. 4. FIG. 6 is a cross-sectional view showing the main part of the liquid crystal display panel 1 along the longitudinal direction of the other interconnect Y shown in FIG. 4. FIG. 7 is a cross-sectional view of the liquid crystal display panel 1 along the cutting line $L_1$-$L_1$ shown in FIG. 4. FIG. 8 is a cross-sectional view of the liquid crystal display panel 1 along the cutting line $L_2$-$L_2$ shown in FIG. 4. FIG. 9 is a cross-sectional view of the liquid crystal display panel 1 along the cutting line $L_3$-$L_3$ shown in FIG. 4.

The interconnects 34, as shown in FIG. 4 to FIG. 9, have an inside interconnect section 40 arranged on the display area H side within the interconnect area L, and an outside interconnect section 41 arranged on the terminal 33 terminal area T side within the interconnect area L. The inside interconnect section 40 is electrically connected to the row control circuit 30, and the outside interconnect section 41 is electrically connected to the terminals 33. In this manner, the inside interconnect section 40 and the outside interconnect section 41 have individually different constitutions, the inside interconnect section 40 being made interconnects suitable for frame narrowing, and the outside interconnect section 41 being made interconnects that, in consideration of the avoidance of short circuits caused by debris by easily protecting the outside interconnect section 41 corrosion.

The inside interconnect section 40 includes a first interconnect layer 42 having a first sheet resistance, a second interconnect layer 43 having a second sheet resistance that is higher than the first sheet resistance, and an inside connection section 44 that connects the first interconnect layer 42 and the second interconnect layer 43.

The first interconnect layer 42, on the surface of the side of the element substrate 2 opposite the liquid crystal layer 4, is disposed on a layer above the second interconnect layer 43. Specifically, the first interconnect layer 42, on the surface of the interlayer insulating film 14, is formed of the same materials as the source electrodes 11 and the column control lines $D_1, D_2, \ldots, D_M$. A protective film 17 is formed over the surface of the interlayer insulating film 14 so as to cover the first interconnect layer 42. In the present embodiment, a thin film with a base of, for example, aluminum (Al) is used as the first interconnect layer 42. The sheet resistance (first sheet resistance) of the thin film is approximately 0.1 Ω/□.

The second interconnect layer 43, on the surface on the side of the element substrate 2 opposite the liquid crystal layer 4, is disposed on a layer below the first interconnect layer 42. Specifically, the second interconnect layer 43, on the surface of the gate insulating film 13, is formed using the same material as the gate electrodes 10 and the row control lines $G_1, G_2, \ldots, G_M$. An interlayer insulating film 14 covering the second interconnect layer 43 is formed on the surface of the gate insulating film 13. In the present embodiment, a thin film with a base of, for example, tungsten (W) is used as the second interconnect layer 43. The sheet resistance (second sheet resistance) of the thin film is approximately 0.5 Ω/□.

The inside connection section 44 is provided at a location at which the lengths to the first interconnect layer 42 and to the second interconnect layer 43 are equal. The inside connection section 44 is disposed in an area that is further to the inside than the sealing material S of the interconnect area L.

An interlayer insulating film 14 is provided between the first interconnect layer 42 and the second interconnect layer 43.

The inside connection section 44, via a contact hole 44a passing through the interlayer insulating film 14, connects the first interconnect layer 42 and the second interconnect layer 43. In the present embodiment, an inorganic insulating film of, for example, silicon oxide ($SiO_x$) or silicon nitride ($SiN_x$) is mainly used as the interlayer insulating film 14.

The outside interconnect section 41 includes a third interconnect layer 45 that is connected to one of the first interconnect layer 42 and the second interconnect layer 43. The third interconnect layer 45 has a second sheet resistance that is the same as that of the second interconnect layer 43 and is disposed on the same later as the second interconnect layer 43 (on a layer below the first interconnect layer 42). Specifically, the third interconnect layer 45, on the surface of the gate insulating film 13, is formed using the same material as the second interconnect layer 43. The interlayer insulating film 14 covering the third interconnect layer 45 is formed on the surface of the gate insulating layer 13. The third interconnect layer 45 can be formed as an interconnect layer having a high sheet resistance (third sheet resistance) that is different from that of the first interconnect layer 42 and the second interconnect layer 43.

The inside interconnect section 40 and the outside interconnect section 41 are connected via the outside connection section 46. The outside connection section 46 is disposed at a position that overlaps with the sealing material S of the interconnect area L. The outside connection section 46 is covered by the protective film 17. The outside connection section 46 may be covered by the sealing material S in place of the protective film 17.

Between one interconnect X of neighboring interconnects of the plurality of interconnects 34 (the n-th numbered one, where n represents a position odd or even number) and the other interconnect Y ((n+1)th), the dispositions of the first interconnect layer 42 and the second interconnect layer 43 constituting the inside interconnect section 40 are different.

Specifically, in the one interconnect X the first interconnect layer 42 is on the column control circuit 30 (display area H) side, with the inside connection section 44 therebetween, and the second interconnect layer 43 is on the terminal 33 (terminal area T) side. That is, the one interconnect X, moving from the column control circuit 30 side toward the terminal 33 side is connected to the first interconnect layer 42, the inside connection section 44, the second interconnect layer 43, the outside connection section 46, and the third interconnect layer 45, in that sequence.

In the one interconnect X, the first interconnect layer 42 is electrically connected to the source electrode of the TFT 47 constituting the column control circuit 30. In the one interconnect X, the first interconnect layer 42 is disposed on the same layer as the source electrode of the TFT 47. That is, the first interconnect layer 42, on the surface of the interlayer insulating film 14, is formed of the same material as the source electrode of the TFT 47.

In the one interconnect X, the second interconnect layer 43 is electrically connected to the third interconnect layer 45 via the outside connection section 46. In the one interconnect X, the second interconnect layer 43 and the third interconnect layer 45 are formed on the same interconnect layer. For this reason, although the outside connection section 46 becomes unnecessary, even in this case the outside connection section 46 is disposed as a formality.

For example, if the outside connection section 46 is disposed uniformly between the inside interconnect section 40 and the outside interconnect section 41 as a convenience in drafting when disposing the plurality of interconnects 34, dummy outside connection sections 46 (marked in FIG. 4 by broken lines) are disposed midway in the one interconnect X and a proper outside connection section 46 (marked in FIG. 4 by solid lines) are disposed midway in the other interconnect Y, so as to be arranged alternately.

In the other interconnect Y, the second interconnect layer 43 is disposed on the column control circuit 30 (display area H) side, with the inside connection section 44 therebetween, and the first interconnect layer 42 is disposed on the terminal 33 (terminal area L) side. That is, the other interconnect Y, moving from the column control circuit 30 side toward the terminal 33 side is connected to the second interconnect layer 43, the inside connection section 44, the first interconnect layer 42, the outside connection section 46, and the third interconnect layer 45, in that sequence.

In the other interconnect Y, the second interconnect layer 43 is connected to the source electrode of the TFT 47 constituting the column control circuit 30. In the other interconnect Y, the second interconnect layer 43 is disposed on a layer below the source electrode of the TFT 47. For this reason, the second interconnect layer 43 is electrically connected to the upper interconnect layer 49 formed on the same layer as the source electrode of the TFT 47, via a contact hole 48 passing through the interlayer insulating film 14, after which it is electrically connected to the source electrode of the TFT 47 via the upper interconnect layer 49. The upper interconnect layer 49 on the surface of the interlayer insulating film 14 is formed of the same material as the source electrode of the TFT 47.

In the other interconnect Y, the first interconnect layer 42 is electrically connected to the third interconnect layer 45 via the outside connection section 46. That is, the outside connection section 46 is electrically connected to the first interconnect layer 42 on the upper layer side and the third interconnect layer 45 on the lower layer side, via a contact hole 46a passing through the interlayer insulating film 14.

In the one interconnect X and the other interconnect Y, the third interconnect layer 45 is electrically connected to the terminal 33. The terminal 33 includes a lower electrode layer 50, an upper electrode layer 51, and a transparent electrode layer 52.

The lower electrode layer 50 is disposed on the same layer as the third interconnect layer 45. That is, the lower electrode layer 50 on the surface of the gate electrode film 13 is formed using the same material as the third interconnect layer 45.

The upper electrode layer 51 is electrically connected to the lower electrode layer 50 via a contact hole 53 passing through the interlayer insulating film 14. The upper electrode layer 51 over the surface of the interlayer insulating film 14 is formed using the same material as the first interconnect layer 42.

The transparent electrode layer 52 is formed on the surface of the upper electrode layer 51 using the same material as the pixel electrode 6. Although it is not illustrated, a flexible printed circuit (FPC) board is mounted to the terminal 33, with an anisotropic conductive film therebetween.

In the element substrate 2 having the constitution described above, by making the disposition of the first interconnect layer 42 and the second interconnect layer 43 constituting the inside interconnect section 40 different between one interconnect X and another interconnects Y of the plurality of interconnects 34 that are neighboring, the interconnect pitch of the inside interconnect section 40 can be narrowed. Because the inside interconnect section 40 includes a second interconnect layer 43 having a sheet resistance that is higher than that of the first interconnect layer 42, the interconnect resistance obtained by lengthening the second interconnect layer 43 can be used as a protective resistance with respect to electrostatic discharge. This enables frame narrowing of the interconnect area L and also enables the achievement of an active matrix substrate that does not require a protective circuit.

<Planar Interconnect Layout>

In the basic constitution of the interconnects 34 shown in FIG. 4 to FIG. 9, although the description was simplified to show the plurality of interconnects 34 as straight lines, the actual interconnects 34 are constituted so as to have a first interconnect group 341 arranged so that the interconnect pitch becomes shorter moving from the display area H side toward the terminal area T side, and a second interconnect group 342 neighboring the first interconnect group 341 and arranged so that the interconnect pitch becomes shorter moving from the display area H side toward the terminal area T side.

Figure 10:
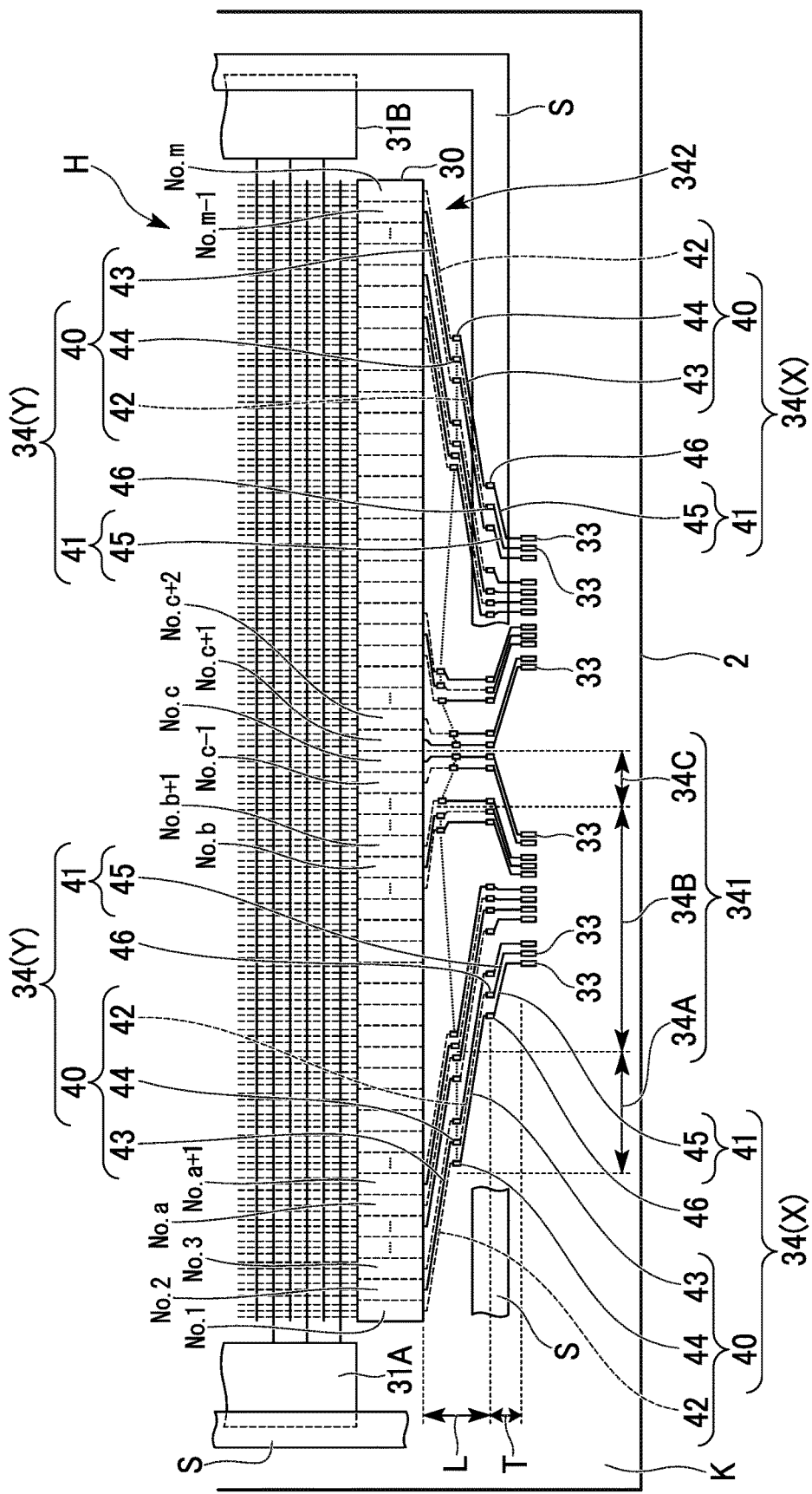
FIG. 10 is a plan view showing the plan-view layout of the interconnects of the element substrate that is the first embodiment.

Therefore, in the description to follow, the planar layout of the plurality of interconnects 34 disposed in the interconnect area L of the element substrate 2 will be specifically described, with reference made to FIG. 10.

In order to describe the planar playout of the plurality of interconnects 34, FIG. 10 is a plan view of the main part centered about the interconnect area L of the element substrate 2. In FIG. 10, the first interconnect layer 42 is indicated by broken lines and the second interconnect layer 43 and the third interconnect layer 45 are indicted by solid lines.

In the present embodiment, as shown in FIG. 10, the number of pixels is shown as a liquid crystal display panel 1 having a resolution of 1080×RGB×1920 (so-called full HD). Because one pixel is constituted by three sub-pixels R, G, and B, the display area H has disposed therein 1080×3 column control lines $D_1, D_2, \ldots, D_M$ (where M=3240) and 1920 row control lines $G_1, G_2, \ldots, G_N$ (where N=1920).

In the terminal area T, m (where m=1080) terminals 33 are disposed in a straight line along the direction of arrangement of the plurality of column control lines $D_1, D_2, \ldots, D_M$ (column direction). Of these, in the left-side area about the center part of the terminal area T, m/2 (that is, 540) terminals 33 are arranged in a straight line to match the first interconnect group 341. Similarly, in the right-side area about the center part of the terminal area T, m/2 (that is, 540) terminals 33 are arranged in a straight line to match the second interconnect group 342.

In the interconnect area L, m interconnects 34 are disposed along the direction of arrangement of the plurality of column control lines $D_1, D_2, \ldots, D_M$ (column direction). Of these, in the left-side area about the center part of the interconnect area L, the first interconnect group 341, which includes m/2 interconnects 34, is disposed. Similarly, in the right-side area about the center part of the interconnect area L, the second interconnect group 342, which includes m/2 interconnects 34, is disposed.

In this case, because the first interconnect group 341 and the second interconnect group 342 are positioned symmetrically about the center part of the arrangement direction of the interconnects 34, in the present embodiment, one interconnect group (the first interconnect group 341 shown in FIG. 10) will be taken as an example to describe the planar layout of the plurality of interconnects 34.

In the first interconnect group 341, the plurality of interconnects 34 are arranged so that, between the column control circuit 30 and each of the plurality of terminals 33, the plurality of interconnects 34 fans inward (the interconnect pitch becomes shorter) from the column control circuit 30 side toward the terminal 33 side.

Of the plurality of interconnects 34 of the first interconnect group 341, the inside interconnect section 40 forming one part of the interconnects 34 is arranged so as to remain mutually parallel, the interconnect pitch being maintained from the column control circuit 30 side toward the terminal 33 side. The inside interconnect section 40 forming another part of interconnects 34 is arranged so that the interconnect pitch shortens from the column control circuit 30 side to the terminal 33 side. The outside interconnect section 41 is arranged so that the interconnect pitch shortens from the column control circuit 30 side toward the terminal 33 side. The plurality of interconnects 34 may be constituted so that, rather than including the above-noted inside interconnect section 40 that is arranged in parallel, all the inside interconnect section 40 is arranged so that the interconnect pitch is shortened from the column control circuit 30 side toward the terminal 33 side.

The first interconnect group 341 includes a first partial interconnect group 34A, a second partial interconnect group 34B, and a third partial interconnect group 34C. Division into the first partial interconnect group 34A, the second partial interconnect group 34B, and the third partial interconnect group 34C is made in view of the differences therebetween in the arrangement directions of the inside connection section 44 among the interconnects 34 belonging each part of interconnect groups 34A, 34B, and 34C.

Of these, the first partial interconnect group 34A, with the left side as shown in FIG. 10 being the 1st, has a total of a interconnects 34, each arranged between the 1st to the a-th column control circuit 30 toward the right side as shown in FIG. 10 and the plurality of terminals 33.

Of this, the second partial interconnect group 34B has a total of (b-a) interconnects 34, each arranged between the (a+1)th to the b-th column control circuit 30 and the plurality of terminals 33.

The third partial interconnect group 34C has a total of (c-b) interconnects 34 each arranged between the (b+1)th to the c-th column control circuit 30 and the plurality of terminals 33.

In the first partial interconnect group 34A, the direction of arrangement of the inside connection section 44 and the direction of arrangement of the plurality of terminals 33 are parallel. The direction of arrangement of the outer connection section 46 and the direction of arrangement of the plurality of terminals 33 are also parallel. Additionally, the spacing in the inside connection section 44 and the spacing in the outside connection section 46 are the same interconnect pitch as the interconnects 34 that are arranged from the column control circuit 30.

Therefore, in the first partial interconnect group 34A, the first interconnect layer 42 or the second interconnect layer 43 that connects between the column control circuit 30 and the inside connection section 44 and the second interconnect layer 43 or the first interconnect layer 42 that connects between the inside connection section 44 and the outside connection section 46 can be extended in the same direction (lower-right direction). In the first partial interconnect group 34A, it is possible to connect from the column control circuit 30 to the outside connection section 46 with the shortest distance.

In the first partial interconnect group 34A, the inside connection section 44 is disposed at a position at which the lengths of the first interconnect layer 42 and the second interconnect layer 43 are equal. This enables, with the first partial interconnect group 34A, the difference in the sheet resistance of the inside interconnect section 40 between neighboring interconnects 34 to be made small. In particular, this enables, with the first partial interconnect group 34A, the sheet resistance of the inside interconnect section 40 to be made the same between neighboring interconnects 34.

In the first partial interconnect group 34A, the length of the third interconnect layer 45 (outside interconnect layer 41) that connects between the outside connection section 46 and the terminals 33 varies. That is, the length of the third interconnect layer 45 varies continuously and gradually in accordance with the positional relationship between the outside connection section 46 and the terminals 33. For this reason, the difference in lengths of the third interconnect layer 45 is not a cause of display variations caused by divisions into blocks.

In the second partial interconnect group 34B, the arrangement direction of the inside connection section 44 is not parallel to the arrangement direction of the plurality of terminals 33 but rather at an inclination (in the upper-right direction). That is, the inside connection section 44 shifts from the (a+1)th (left side) interconnect 34 toward the b-th (right side) interconnect 34 in the direction approaching the column control circuit 30. In the second partial interconnect group 34B, the spacing of the inside connection section 44 is slightly narrower in the direction of arrangement of the plurality of terminals 33 than the case of the first partial interconnect group 34A.

This enables, in the second interconnect group 34B, the extension of the first interconnect layer 42 or the second interconnect layer 43 that connects between the column control circuit 30 and the inside connection section 44 and the second interconnect layer 43 or the first interconnect layer 42 that connects between the inside connection section 44 and the outside connection section 46 to be extended in the same direction (lower-right direction). In the second partial interconnect group 34B, it is possible to make connection from the column control circuit 30 up to the outside connection section 46 efficiently, while maintaining the interconnect pitch of neighboring interconnects 34.

In the second partial interconnect group 34B, the inside connection section 44 is disposed at a position at which the lengths of the first interconnect layer 42 and the second interconnect layer 43 are equal. In the second partial interconnect group 34B, this enables a continuous change in the sheet resistance without greatly changing the sheet resistance of the inside interconnect section 40 between neighboring interconnects 34. The interconnect pitch of the inside interconnect section 40 can be made narrow.

In the second partial interconnect group 34B, the arrangement direction of the outside connection section 46 and the arrangement direction of the plurality of terminals 33 are parallel. The spacing in the outside connection section 46 is set to be narrower than the spacing in the inside connection section 44 in the first partial interconnect group 34A. Therefore, in the second partial interconnect group 34B, the third interconnect layer 45 (outside interconnect section 41) connecting the outside connection section 46 and the terminals 33 can be extended toward the same direction (lower-right direction) as the inside interconnect section 40. In the case in which, because of the positional relationship between the outside connection section 46 and the terminals 33, the outside connection section 46 is shifted more to the right than the terminals 33, the third interconnect layer 45 (outside interconnect section 41) is extended in the direction that is opposite from the inside interconnect section 40 (lower-left direction).

In the second partial interconnect group 34B, the length of the third interconnect layer 45 that connects between the outside connection section 46 and the terminals 33 varies. That is, the length of the third interconnect layer 45 varies continuously and gradually in accordance with the positional relationship between the outside connection section 46 and the plurality of terminals 33. For this reason, the difference in lengths of the third interconnect layer 45 is not a cause of display variations caused by divisions into blocks.

In the third partial interconnect group 34C, the arrangement direction of the inside connection section 44 is not parallel to the arrangement direction of the plurality of terminals 33 but rather at an inclination (in the lower-right direction). That is, the inside connection section 44 shifts from the (b+1)th (left side) interconnect 34 toward the c-th (right side) interconnect 34 in the direction moving away from the column control circuit 30. In the third partial interconnect group 34C, the spacing of the inside connection section 44 is slightly narrower than the case of the first partial interconnect group 34A.

This enables, in the third interconnect group 34C, the extension of the first interconnect layer 42 or the second interconnect layer 43 that connects between the column control circuit 30 and the inside connection section 44 and the second interconnect layer 43 or the first interconnect layer 42 that connects between the inside connection section 44 and the outside connection section 46 to be made in the same direction (lower right direction). In the third partial interconnect group 34C, it is possible to make connection from the column control circuit 30 up to the outside connection section 46 efficiently, while maintaining the interconnect pitch of neighboring interconnects 34.

In the third partial interconnect group 34C, the inside connection section 44 is disposed at a position at which the lengths of the first interconnect layer 42 and the second interconnect layer 43 are equal. In the third partial interconnect group 34C, this enables a continuous change in the sheet resistance without greatly changing the sheet resistance of the inside interconnect section 40 between neighboring interconnects 34. The interconnect pitch of the inside interconnect section 40 can be made narrow.

In the third partial interconnect group 34C, the length of the third interconnect layer 45 that connects between the outside connection section 46 and the terminals 33 varies. That is, the length of the third interconnect layer 45 varies continuously and gradually in accordance with the positional relationship between the outside connection section 46 and the plurality of terminals 33. For this reason, the difference in lengths of the third interconnect layer 45 is not a cause of display variations caused by divisions into blocks.

Because the second interconnect group 342 is in a position relationship that is symmetrical to the above-described first interconnect group 341, the interconnects 34 from the (c+1)th up to the m-th are in positional relationships (planar layout) that are symmetrical to the 1st to the c-th interconnect 34. In this case, the c-th interconnect 34 at the position in the center of the plurality of interconnects 34 and the (c+1)th interconnect 34 are arranged with the same dispositions of the above-described neighboring interconnects X and Y. Separate from the symmetrical positional relationship (planar layout) between the first interconnect group 341 and the second interconnect group 342, different interconnects X and Y may be arranged between the c-th interconnect 34 and the (c+1)th interconnect 34.

<Interconnect Paths>

Next, the different paths of the plurality of interconnects 34 will be divided and described, as shown in FIG. 11, which is a set of plan views showing the plurality of interconnects 34 shown in FIG. 10, classified by path.

The plurality of interconnects 34 can be classified into the paths α, β, γ, δ, and ∈. The plurality of interconnects 34 change in form in the sequence of the paths α, β, γ, δ, and ∈, when they are seen in plan view, as the interconnect length is gradually changed. Although the interconnect X and the interconnect Y have different positions of the first interconnect layer 42 and the second interconnect layer 43 constituting the inside interconnect section 40, the paths α, β, γ, δ, and ∈ of the interconnects 34 are the same.

Specifically, the path α is, as the inside interconnect section 40, an interconnect 34 that includes the first interconnect layer 42 and the second interconnect layer 43 that have the same relatively long distances and, as the outside interconnect section 41, an interconnect 34 that includes the third interconnect layer 45 that has a relatively middle-range distance that is shorter than the first interconnect layer 42 and the second interconnect layer 43. The outside connection section 46 is shifted to the left of the terminal 33. In the case of a large screen, in the longest part of the interconnects 34 (the 1st interconnect), there are cases in which the first interconnect layer 42 and the second interconnect layer 43 may have approximately the same interconnect length as the outside interconnect section 41.

In the path α, it is the interconnect layer having a high sheet resistance that contributes to the size of the interconnect resistance, regardless of whether it is an interconnect X or an interconnect Y. Therefore, in the path α, the second interconnect layer 43 and the third interconnect layer 45, which have sheet resistances higher than that of the first interconnect layer 42, are included, and the interconnect resistance obtained by the second interconnect layer 43 and the third interconnect layer 45 can be used as a protective resistance with respect to electrostatic discharge.

The path β is, as the inside interconnect section 40, an interconnect 34 that includes the first interconnect layer 42 and the second interconnect layer 43 that have the same relatively long distances and, as the outside interconnect section 41, an interconnect 34 that includes the third interconnect layer 45 that has a relatively short distance that is shorter than the first interconnect layer 42 and the second interconnect layer 43. The outside connection section 46 is shifted to the left of the terminal 33.

In the path β, it is the interconnect layer having a high sheet resistance that contributes to the size of the interconnect resistance, regardless of whether it is an interconnect X or an interconnect Y. Therefore, in the path β, the second interconnect layer 43 and the third interconnect layer 45, which have sheet resistances higher than that of the first interconnect layer 42, are included, and the interconnect resistance obtained by the second interconnect layer 43 and the third interconnect layer 45 can be used as a protective resistance with respect to electrostatic discharge.

The path γ is, as the inside interconnect section 40, an interconnect 34 that includes the first interconnect layer 42 and the second interconnect layer 43 that have the same relatively long distances and, as the outside interconnect section 41, an interconnect 34 that includes the third interconnect layer 45 that has a relatively short distance that is shorter than the first interconnect layer 42 and the second interconnect layer 43. The outside connection section 46 is shifted to the right of the terminal 33.

In the path γ, it is the interconnect layer having a high sheet resistance that contributes to the size of the interconnect resistance, regardless of whether it is an interconnect X or an interconnect Y. Therefore, in the path γ, the second interconnect layer 43 and the third interconnect layer 45, which have sheet resistances higher than that of the first interconnect layer 42, are included, and the interconnect resistance obtained by the second interconnect layer 43 and the third interconnect layer 45 can be used as a protective resistance with respect to electrostatic discharge.

The path δ is, as the inside interconnect section 40, an interconnect 34 that includes the first interconnect layer 42 and the second interconnect layer 43 that have the same relatively middle-range distances and, as the outside interconnect section 41, an interconnect 34 that includes the third interconnect layer 45 that has a relatively middle-range distance. The outside connection section 46 is shifted to the right of the terminal 33.

In the path δ, it is the interconnect layer having a high sheet resistance that contributes to the size of the interconnect resistance, regardless of whether it is an interconnect X or an interconnect Y. Therefore, in the path δ, the second interconnect layer 43 and the third interconnect layer 45, which have sheet resistances higher than that of the first interconnect layer 42, are included, and the interconnect resistance obtained by the second interconnect layer 43 and the third interconnect layer 45 can be used as a protective resistance with respect to electrostatic discharge.

The path $\in$ is, as the inside interconnect section 40, an interconnect 34 that includes the first interconnect layer 42 and the second interconnect layer 43 that have the same relatively short distances and, as the outside interconnect section 41, an interconnect 34 that includes the third interconnect layer 45 that has a relatively long distance. The outside connection section 46 is shifted to the right of the terminal 33.

In the path $\in$, it is the interconnect layer having a high sheet resistance that contributes to the size of the interconnect resistance, regardless of whether it is an interconnect X or an interconnect Y. Therefore, in the path $\in$, the second interconnect layer 43 and the third interconnect layer 45, which have sheet resistances higher than that of the first interconnect layer 42, are included, and the interconnect resistance obtained by the second interconnect layer 43 and the third interconnect layer 45 can be used as a protective resistance with respect to electrostatic discharge.

The first partial interconnect group 34A includes the interconnect X and the interconnect Y and includes the interconnects 34 of the path α and the path β with regard to both the interconnects X and Y.

The second partial interconnect group 34B includes the interconnect X and the interconnect Y and includes the interconnects 34 of the path γ and the path δ with regard to both the interconnects X and Y.

The third partial interconnect group 34C includes the interconnect X and the interconnect Y and includes the interconnect 34 of the path Σ with regard to both the interconnects X and Y.

Therefore, the first interconnect group 341 includes interconnects 34 of any one of the paths α, β, δ, γ, and $\in$. The lengths of the interconnects 34 constituting the first interconnect group 341 become shorter going from the path α to the path $\in$, and with regard to the interconnects 34 of the paths δ and $\in$, without traveling over the shortest path between the column control circuit 30 and the terminals 33, by traveling over a long path, it is possible to avoid having the interconnects 34 becoming short.

In particular, an interconnect 34 of the path $\in$ is the shortest interconnect 34 among the paths α, β, γ, δ, and $\in$. The interconnect 34 of the path $\in$ is constituted by the inside interconnect section 40 including the first interconnect layer 42 or the second interconnect layer 43, which is extended in the direction orthogonal with respect to the direction of arrangement of the plurality of terminals 33, and the outside interconnect section 41, which includes the third interconnect layer 45, which is extended at an inclination with respect to the direction of arrangement of the plurality of terminals 33.

This constitution avoids the shortening of the length of the interconnect 34 in an interconnect 34 of the path $\in$. Making the third interconnect layer 45, which has a high sheet resistance, long results in a sufficient protective resistance with respect to electrostatic discharge.

In this case, as a reference example, the planar layout of a plurality of interconnects 234 of the element substrate 200 shown in FIG. 12 will be described.

Figure 12:
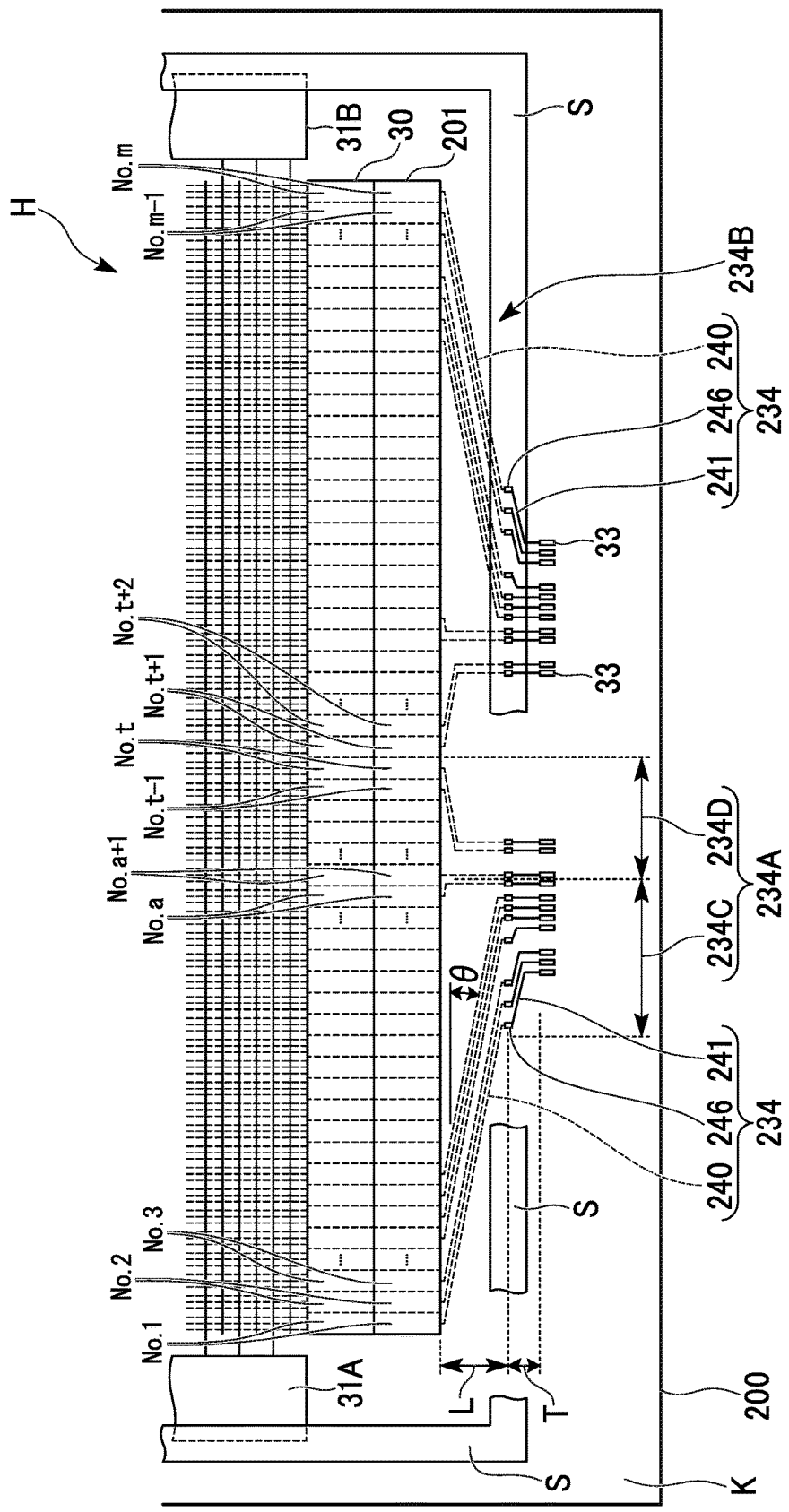
FIG. 12 is a plan view showing the main part centered around the interconnect area of the element substrate, which is a reference example.

FIG. 12 is a plan view showing the main part centered about the interconnect area of the element substrate 200, which is shown as a reference example.

The element substrate 200 shown in FIG. 12, in contrast to the element substrate 2, the planar layout of the plurality of interconnects 234 of which is shown in the above-noted FIG. 10, has a protective circuit 201 to prevent circuit breakdown by electrostatic discharge (ESD). The other constituent elements of the element substrate 200 are the basically the same as those of the element substrate 2 shown in FIG. 10. Therefore, locations in the element substrate 200 shown in FIG. 12 that are the same as those in the element substrate 2 shown in the above-noted FIG. 10 have the same reference symbols applied thereto and the descriptions thereof will be omitted.

The protective circuit 201 is disposed between the column control circuit 30 and the plurality of interconnects 234, along the column control circuit 30. The plurality of interconnects 234 are arranged between the protective circuit 201 and the plurality of terminals 33.

The plurality of interconnects 234 has an inside interconnect section 240 arranged on the protective circuit 201 side and an outside interconnect section 241 arranged on the terminal 33 side. The inside interconnect section 240 is made of an upper interconnect layer having a low sheet resistance that is the same as that of the above-noted first interconnect layer 42. The outside interconnect section 241 is made of a lower interconnect layer having a high sheet resistance that is the same as that of the above-noted third interconnect layer 45. The inside interconnect section 240 and the outside interconnect section 241 are connected via a connection section 246 that is made of the same connection section as the above-noted outside connection section 46.

The plurality of interconnects 234 symmetrically sandwich the center part in the arrangement direction thereof (column direction) so that the first interconnect group 234A and the second interconnect group 234B are disposed separately. The first interconnect group 234A and the second interconnect group 234B are arranged so that each of them forms a narrowing fan-in shape (with the interconnect pitch becoming shorter) going from the protective circuit 201 side toward the terminal 33 side.

Because the first interconnect group 234A and the second interconnect group 234B are in a positional relationship so that they symmetrically sandwich the center part of the interconnects 234 in the arrangement direction, in this reference example, one interconnect group (the first interconnect group 234A shown in FIG. 12) will be taken as an example to describe the planar layout of the plurality of interconnects 234.

The first interconnect group 234A includes a first partial interconnect group 234C and a second partial interconnect group 234D. Of these, the first partial interconnect group 234C, with the left side as shown in FIG. 12 being the 1st, has a total of s interconnects 234, each arranged between the 1st to the s-th protective circuit 201 toward the right side as shown in FIG. 12 and the plurality of terminals 33. The second partial interconnect group 234D has a total of (t-s) interconnects 234, each arranged between the (s+1)th to the t-th protective circuit 201 and the plurality of terminals 33.

In the first partial interconnect group 234C, the inside interconnect section 240 is arranged an inclination (in the lower-right direction) with an angle of θ toward the connection section 246, the interconnect lengths becoming gradually shorter and bending toward the terminals 33. In the first partial interconnect group 234C, the length varies so as to be shortened as the outside interconnect section 241 moves toward the terminals 33.

In the second partial interconnect group 234D, the inside interconnect section 240 is arranged an inclination (in the lower-left direction) with an angle of θ toward the connection section 246. In the second partial interconnect group 234D, the length varies so as to be the shortest distance as the outside interconnect section 241 moves toward the terminals 33.

Therefore, in the planar layout of the plurality of interconnects 234, the constitution is such that the fanning in of the interconnects 234 is done almost all in the inside interconnect section 240, with the outside interconnect section 241 handling the fanning in the remaining, relatively short region. That is, a part of the outside interconnect section 241 is not fanned in at all and is arranged in parallel, with the same short interconnect pitch as the spacing of the terminals 33.

In this constitution, circuit breakdown by electrostatic discharge (ESD) occurs easily in the shortest interconnects 234, such as the s-th interconnect 234 or the (s+1)th interconnect 234. In the element substrate 200, although the protective circuit 201 is provided for the purpose of preventing this, because the protective circuit 201 is accompanied by a diode or a large transistor or power supply line, the result is a protective circuit 201 with a large size of, for example, approximately 0.5 mm. If a frame of the liquid crystal display panel having a size of several millimeters is considered, the protective circuit 201 size is not negligible.

In contrast, in the element substrate 2 of the present embodiment, in the first interconnect group 341 and the second interconnect group 342, it is possible to achieve frame narrowing of the image area L without disposing a protective circuit.

At this point, the reference path 1 and the reference path 2 shown in FIG. 11 will be described.

The reference path 1 and the reference path 2 are not included in the interconnects 34 of the above-noted element substrate 2.

The reference path 1 is a path in which the first interconnect layer 42 and the second interconnect layer 43 constituting the inside interconnect section 40 and the third interconnect layer 45 constituting the outside interconnect section 41 are connected by the shortest distance. That is, the reference path 1 is the interconnects 34 that include, as the inside interconnect section 40, the first interconnect layer 42 and the second interconnect layer 43, which have the same relatively short distances, and, as the outside interconnect section 41, the third interconnect layer 45 having a relatively short distance.

In the reference path 1, it is the interconnect layer having a high sheet resistance that contributes to the size of the interconnect resistance, regardless of whether it is an interconnect X or an interconnect Y. Therefore, in the reference path 1, the second interconnect layer 43 and the third interconnect layer 45, which have sheet resistances higher than that of the first interconnect layer 42, are short, and it is not possible to obtain a sufficient protective resistance with respect to electrostatic discharge.

The reference path 2 has, as the inside interconnect section 40, an interconnect 34 that includes the first interconnect layer 42 and the second interconnect layer 43, which has the same relatively mid-range distance and, as the outside interconnect section 41, includes the third interconnect layer 45, which has a relatively short distance. However, as shown by the t-th interconnect 234 shown in FIG. 12, the reference path 2 is an interconnect 34 that travels over the shortest path between column control circuit 30 and the inside connection section 44, travels over a bending path between the inside connection section 44 and the outside connection section 46, and travels over the shortest path between the outside connection section 46 and the terminals 33.

In the reference path 2, although the distance from the column control circuit 30 to the terminals 33 is substantially the same as in the path ∈, the lengths of the second interconnect layer 43 and the third interconnect layer 45, which have a sheet resistance higher than that of the first interconnect layer 42, is short. It is therefore not possible to obtain a sufficient protective resistance with respect to electrostatic discharge.

As noted above, in the element substrate 2 of the present embodiment, in the first interconnect group 341 and the second interconnect group 342, it is possible to achieve frame narrowing of the interconnect area L without disposing a protective circuit.

That is, in the element substrate 2, because the proportion within the interconnect area L occupied by the first interconnect group 341 and the second interconnect group 342 can be made small, the result is that it is possible to achieve frame narrowing of the liquid crystal display panel 1.

Also, in the element substrate 2, of the plurality of interconnects 34, the dispositions of the first interconnect layer 42 and the second interconnect layer 43 constituting the inside interconnect section 40 differ between the one interconnect X and the other interconnect Y of neighboring interconnects. This enables the interconnect pitch of the inside interconnect section 40 to be narrowed, without causing a shorts due to foreign matter or the like.

In the first interconnect group 341 and the second interconnect group 342, because the interconnect pitch of the plurality of interconnects 34 that are fanned inward, the result is that the proportion within the interconnect area L occupied by the first interconnect group 341 and the second interconnect group 342 can be made small. Also, the interconnect resistance of the plurality of interconnects 34 changes continuously between one interconnect X and the other interconnect Y of neighboring interconnects. For this reason, variation is not caused in the display of the liquid crystal display panel 1.

In the element substrate 2, the plurality of interconnects 34 is constituted to include an interconnect 34 of any one of the paths α, β, γ, δ, and ∈, and does not include the above-noted path 1 and path 2. Therefore, it includes the second interconnect layer 43 and the third interconnect layer 45 that have a sheet resistance higher than that of the first interconnect layer 42, and an interconnect resistance obtained by the second interconnect layer 43 and the third interconnect layer 45 can be used as a protective resistance with respect to electrostatic discharge.

In particular, circuit breakdown by electrostatic discharge (ESD) occurs easily in the shortest of the interconnects 34 of the plurality of interconnects 34. As a countermeasure, with regard to the shortest interconnect 34, the constitution can be made so as to have an inside interconnect section 40 that includes the first interconnect layer 42 or the second interconnect layer 43 extended in a direction orthogonal with respect to the direction of arrangement of the plurality of terminals 33 and an outside interconnect section 41 that includes a third interconnect layer 45 extended in a direction at an inclination with respect to the direction of arrangement of the plurality of terminals 33, such as in the above-noted E.

This enables lengthening of the third interconnect layer 45, which has a high sheet resistance, the resulting interconnect resistance being usable as a protective resistance with respect to electrostatic discharge (ESD), enabling the achievement of interconnect area frame narrowing without disposing a protective circuit.

In the element substrate 2, the addition of such an interconnect resistance is achieved not by, for example, a serpentine interconnect, but rather by alternating disposition of the interconnect X and the interconnect Y, along with measures taken with regard to the interconnects 34. That is, whereas with a serpentine interconnect it is difficult to dispose the interconnects 34 with a narrow pitch, with the element substrate 2, it is possible to add a resistive component even with narrow-pitch interconnects 34. Experiments by the inventor of the present invention verified that, if there is approximately a 500-Ω resistance component in one interconnect 34, it is possible to achieve a withstand voltage of 200 V in an ESD test using the MM method (0 Ω, 200 pF).

With the element substrate 2, because it is not necessary to dispose the above-noted protective circuit 201, it is possible to achieve frame narrowing of the interconnect area L. Therefore, in the above-noted liquid crystal display panel 1, by using the element substrate 2 that has been subject to frame narrowing without requiring a protective circuit 201 such as this, it is possible to accommodate a further increased resolution and reduction in size.

Second Embodiment

Next, an active matrix substrate and a display device having that active matrix substrate according to the second embodiment will be described.

The liquid crystal display device shown as the second embodiment is the liquid crystal display device that has the liquid crystal display panel 1 shown in FIG. 1 to FIG. 3, wherein a liquid crystal display panel 101 having the element substrate 102 is used in place of the above-noted element substrate 2.

The element substrate 102, with the exception of having terminals 133 and the interconnect 134 in place of the terminals 33 and the interconnects 34 of the above-noted element substrate 2, has the same basic constitution as the element substrate 2. In the description to follow, therefore, in the liquid crystal display panel 101 and the element substrate 102, locations that are the same as in the above-noted liquid crystal display panel 1 and element substrate 2 have been assigned the same reference symbols in the drawings, and the descriptions thereof will be omitted.

Figure 13:
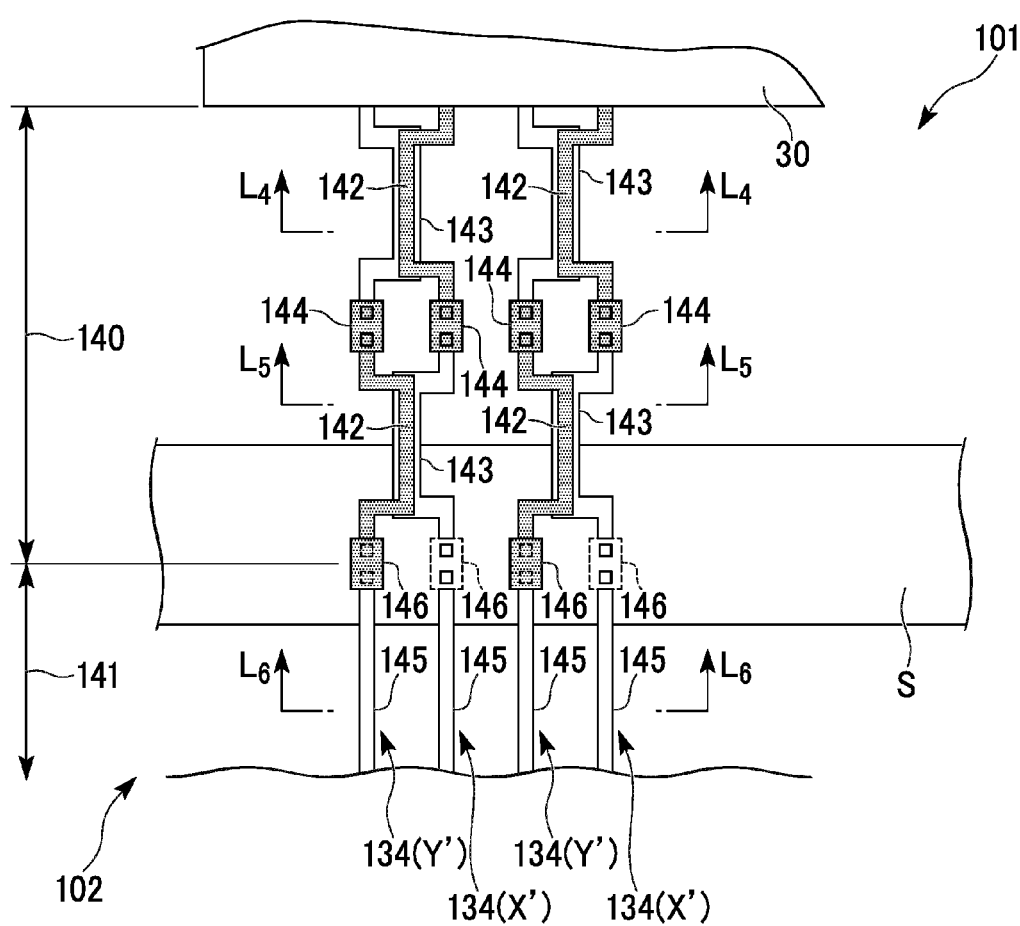
FIG. 13 is an enlarged plan view showing the main part of the interconnect area of a liquid crystal display panel that is a second embodiment.
Figure 14:
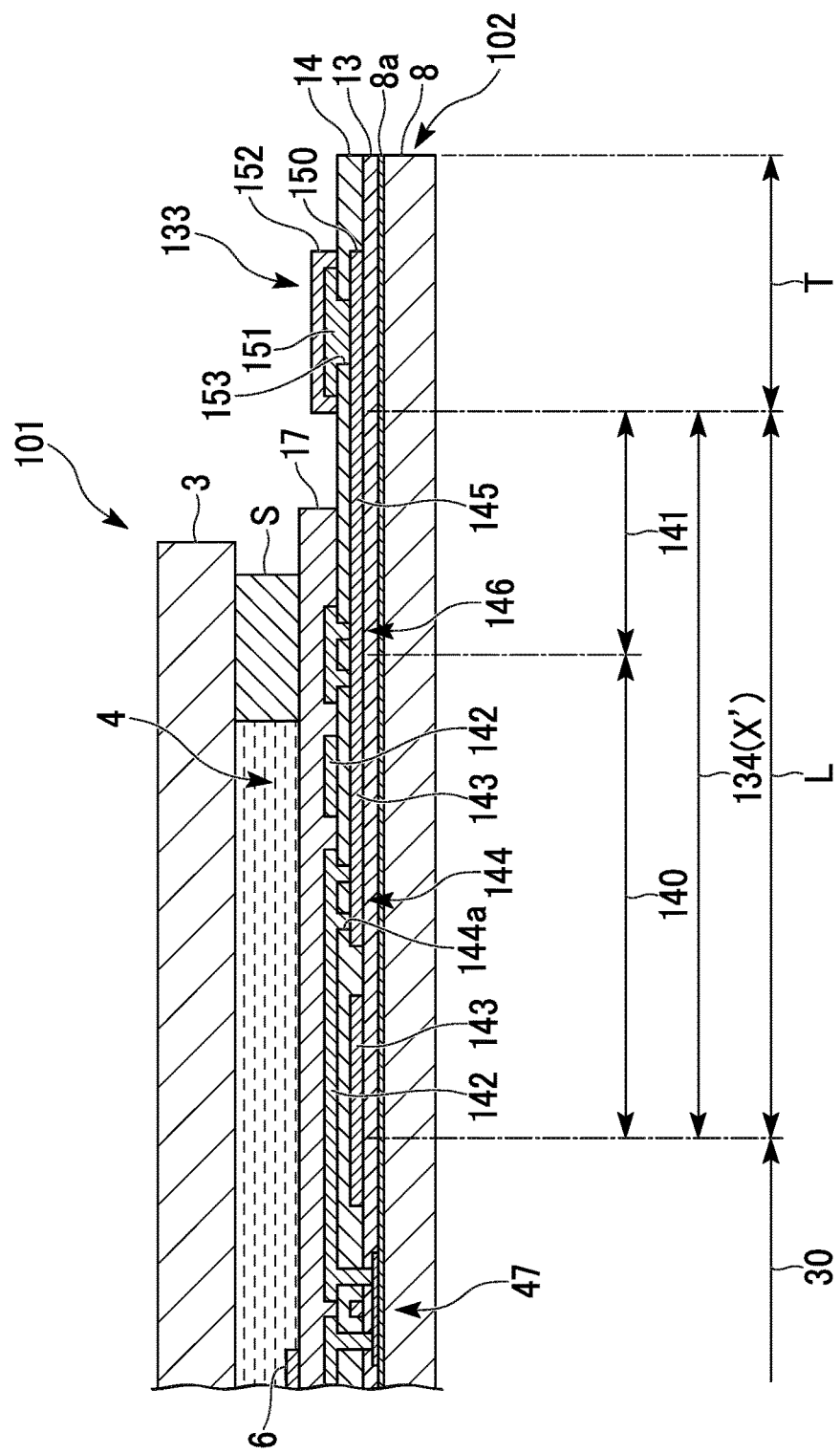
FIG. 14 is a cross-sectional view showing the main part of a liquid crystal display panel along the longitudinal direction of one of the interconnects shown in FIG. 13.
Figure 15:
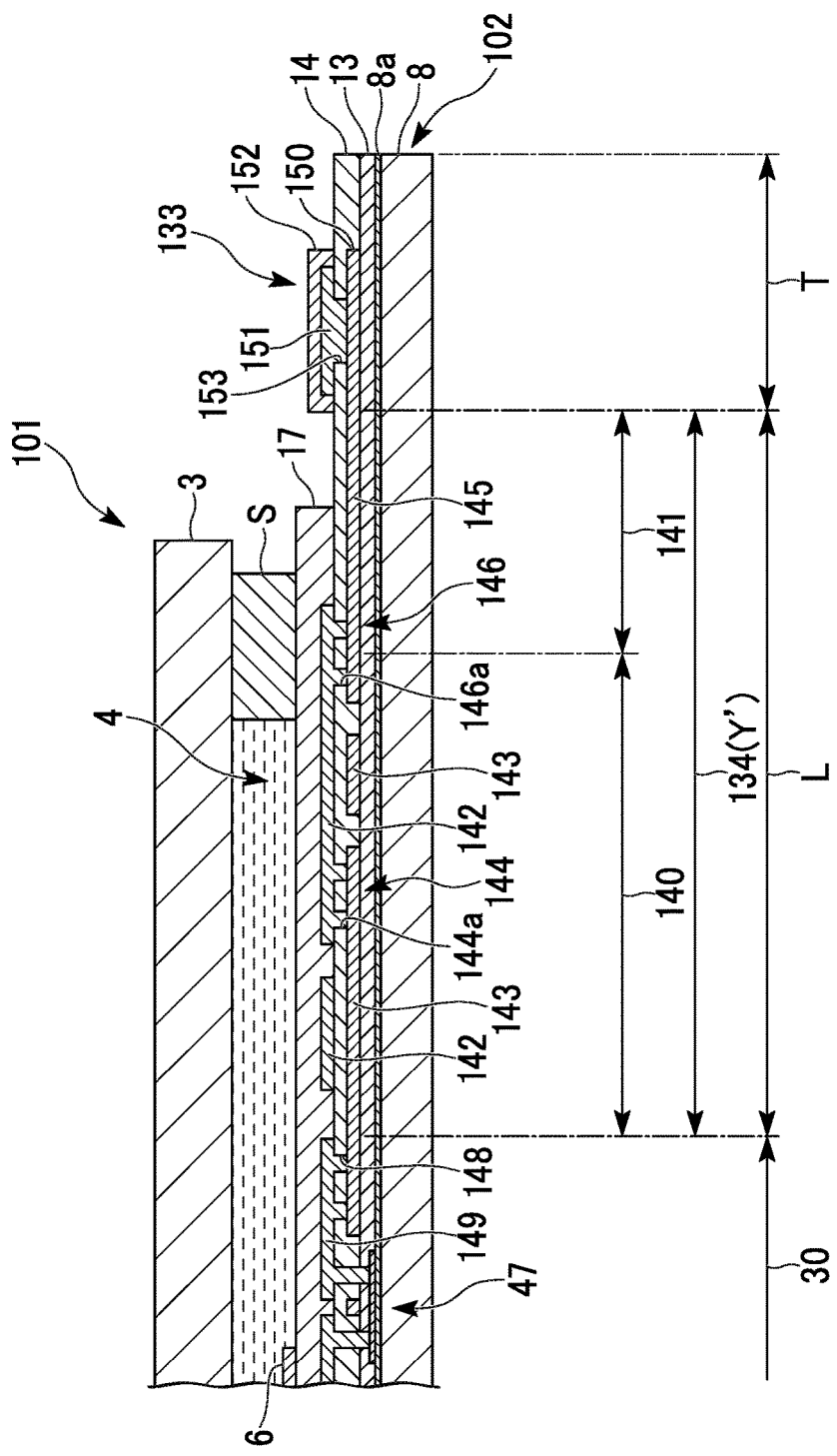
FIG. 15 is a cross-sectional view showing the main part of a liquid crystal display panel along the longitudinal direction of the other interconnect shown in FIG. 13.
Figure 16:
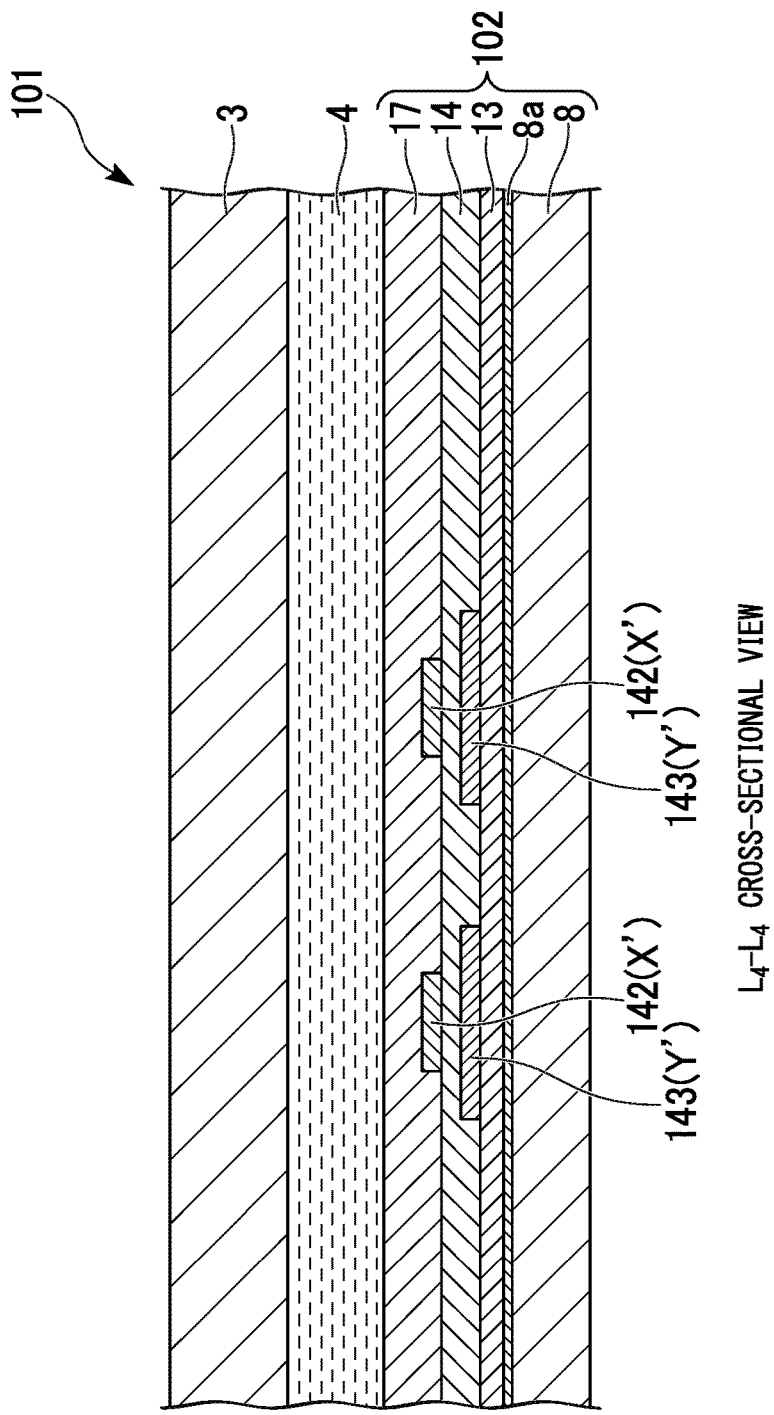
FIG. 16 is a cross-sectional view of the liquid crystal display panel shown in FIG. 13, along the cutting line $L_4$-$L_4$.
Figure 17:
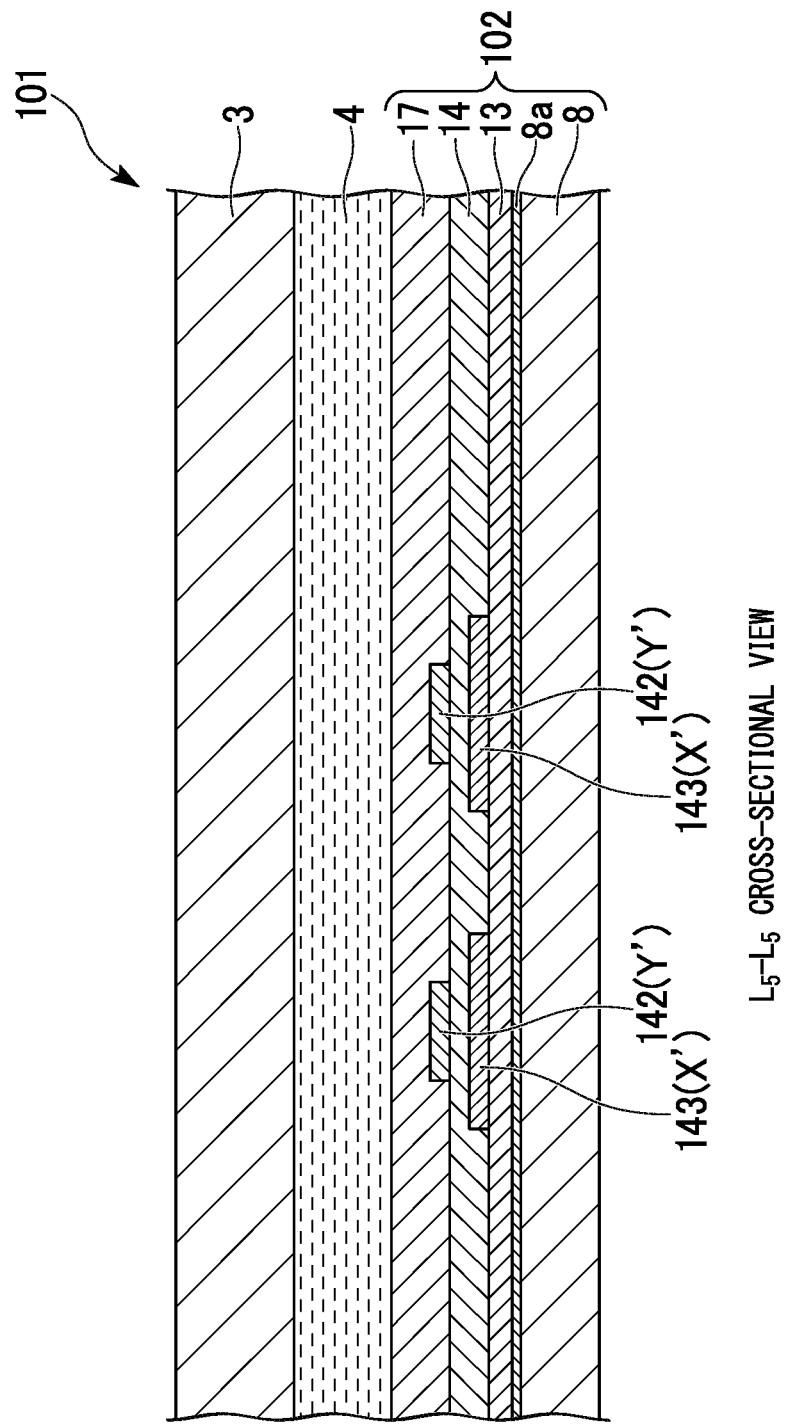
FIG. 17 is a cross-sectional view of the liquid crystal display panel shown in FIG. 13, along the cutting line $L_5$-$L_5$.
Figure 18:
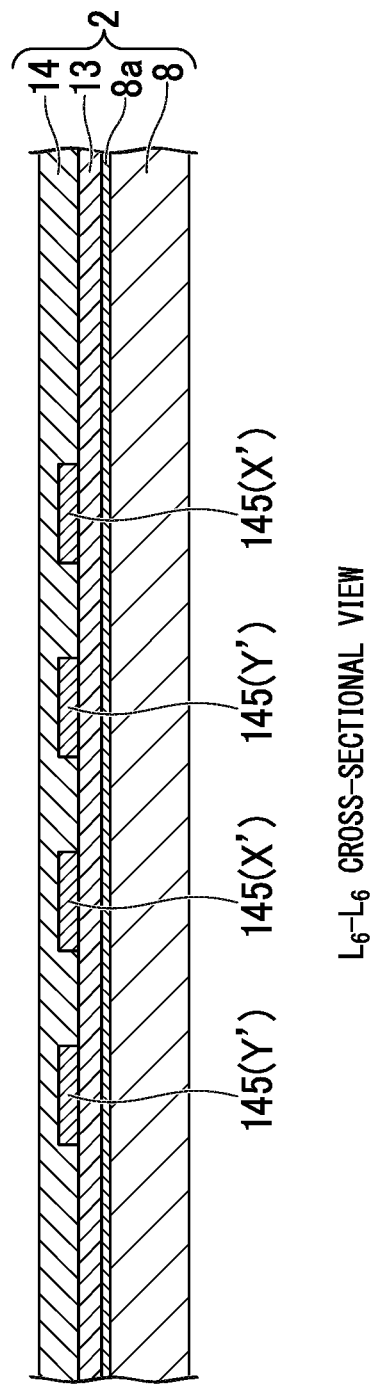
FIG. 18 is a cross-sectional view of the liquid crystal display panel shown in FIG. 13, along the cutting line $L_6$-$L_6$.

FIG. 13 is a plan view showing an enlargement of the main part of the interconnect area L of the liquid crystal display panel 101. FIG. 14 is a cross-sectional view showing the main part of the liquid crystal display panel 1 along the longitudinal direction of the one interconnect X shown in FIG. 13. FIG. 15 is a cross-sectional view showing the main part of the liquid crystal display panel 1 along the longitudinal direction of the other interconnect Y showing in FIG. 13. FIG. 16 is a cross-sectional view of the liquid crystal display panel 1 shown in FIG. 13, along the cutting line $L_4$-$L_4$. FIG. 17 is a cross-sectional view of the liquid crystal display panel 1 shown in FIG. 13, along the cutting line $L_5$-$L_5$. FIG. 18 is a cross-sectional view of the liquid crystal display panel 1 shown in FIG. 13, along the cutting line $L_6$-$L_6$.

<Basic Interconnect Constitution>

First, the basic constitution of the interconnects 134 disposed in the interconnect area L of the element substrate 102 will be described, with references made to FIG. 13 to FIG. 18. In the basic constitution of the interconnects 134 shown in FIG. 13 to FIG. 18, the description will be for a simplification of the plurality of interconnects 134 as parallel straight lines.

As shown in FIG. 13 to FIG. 18, the interconnects 134 have an inside interconnect section 140 arranged on the display area H side within the interconnect area L and an outside interconnect section 141 arranged on the terminal area T side within the interconnect area L. The inside interconnect section 140 is electrically connected to the column control circuit 30, and the outside interconnect section 141 is electrically connected to the terminals 133. In this manner, the inside interconnect section 140 and the outside interconnect section 141 have different constitutions, enabling the inside interconnect section 140 to be made suitable for frame narrowing, and enabling the outside interconnect section 141 to made in consideration of protection from corrosion and suppressing shorts caused by foreign matter.

The inside interconnect section 140 includes a first interconnect layer 142 having a first sheet resistance, a second interconnect layer 143 having a second sheet resistance that is higher than the first sheet resistance, and an inside connection section 144 that connects the first interconnect layer 142 and the second interconnect layer 143.

The first interconnect layer 142, on the surface of the side of the element substrate 102 opposite the liquid crystal layer 4, is disposed on a layer above the second interconnect layer 143. Specifically, the first interconnect layer 142, on the surface of the interlayer insulating film 14, is formed of the same materials as the source electrodes 11 and the column control lines $D_1, D_2, \ldots, D_M$. A protective film 17 is formed over the surface of the interlayer insulating film 14 so as to cover the first interconnect layer 142. In the present embodiment, a thin film with a base of, for example, aluminum (Al) is used as the first interconnect layer 142. The sheet resistance (first sheet resistance) of the thin film is approximately 0.1 Ω/□.

The second interconnect layer 143, on the surface on the side of the element substrate 102 opposite the liquid crystal layer 4, is disposed on a layer below the first interconnect layer 142. Specifically, the second interconnect layer 143, on the surface of the gate insulating film 13, is formed using the same material as the gate electrodes 10 and the row control lines $G_1, G_2, \ldots, G_M$. An interlayer insulating film 14 covering the second interconnect layer 143 is formed on the surface of the gate insulating film 13. In the present embodiment, a thin film with a base of, for example, tungsten (W) is used as the second interconnect layer 143. The sheet resistance (second sheet resistance) of the thin film is approximately 0.5 Ω/□.

The inside connection section 144 is provided at a location at which the lengths to the first interconnect layer 142 and to the second interconnect layer 143 are equal. The inside connection section 144 is disposed in an area that is further to the inside than the sealing material S of the interconnect area L. If the width of the sealing material S is wide, it may be disposed at a position at which at least a part of or the entire inside interconnect section 144 overlaps with the sealing material S when seen in plan view.

An interlayer insulating film 14 is provided between the first interconnect layer 142 and the second interconnect layer 143. The inside connection section 144, via a contact hole 144a passing through the interlayer insulating film 14, connects the first interconnect layer 142 and the second interconnect layer 143. In the present embodiment, an inorganic insulating film of, for example, silicon oxide ($SiO_x$) or silicon nitride ($SiN_x$) is mainly used as the interlayer insulating film 14.

The outside interconnect section 141 includes a third interconnect layer 145 that is connected to one of the first interconnect layer 142 and the second interconnect layer 143. The third interconnect layer 145 has a second sheet resistance that is the same as that of the second interconnect layer 143 and is disposed on the same later as the second interconnect layer 143 (on a layer below the first interconnect layer 142). Specifically, the third interconnect layer 145, on the surface of the gate insulating film 13, is formed using the same material as the second interconnect layer 143. The interlayer insulating film 14 covering the third interconnect layer 145 is formed on the surface of the gate insulating layer 13. The third interconnect layer 145 can be formed as an interconnect layer having a high sheet resistance (third sheet resistance) that is different from that of the first interconnect layer 142 and the second interconnect layer 143.

The inside interconnect section 140 and the outside interconnect section 141 are connected via the outside connection section 146. The outside connection section 146 is disposed at a position that overlaps with the sealing material S of the interconnect area L. The outside connection section 146 is covered by the protective film 17. The outside connection section 146 may be covered by the sealing material S in place of the protective film 17.

Between one interconnect X' of neighboring interconnects of the plurality of interconnects 134 (the n-th numbered one, where n represents a position odd or even number) and the other interconnect Y' ((n+1)th), the dispositions of the first interconnect layer 142 and the second interconnect layer 143 constituting the inside interconnect section 140 are different.

Specifically, in the one interconnect X' the first interconnect layer 142 is on the column control circuit 30 (display area H), with the inside connection section 144 therebetween, and the second interconnect layer 143 is on the terminal 133 (terminal area T) side. That is, the one interconnect X', moving from the column control circuit 30 side toward the terminal 133 side is connected to the first interconnect layer 142, the inside connection section 144, the second interconnect layer 143, the outside connection section 146, and the third interconnect layer 145, in that sequence.

In the one interconnect X', the first interconnect layer 142 is electrically connected to the source electrode of the TFT 47 constituting the column control circuit 30. In the one interconnect X', the first interconnect layer 142 is disposed on the same layer as the source electrode of the TFT 47. That is, the first interconnect layer 142, on the surface of the interlayer insulating film 14, is formed of the same material as the source electrode of the TFT 47.

In the one interconnect X', the second interconnect layer 143 is electrically connected to the third interconnect layer 145 via the outside connection section 146. In the one interconnect X', the second interconnect layer 143 and the third interconnect layer 145 are formed on the same interconnect layer. For this reason, although the outside connection section 146 becomes unnecessary, even in this case the outside connection section 146 is disposed as a formality.

For example, if the outside connection section 146 is disposed uniformly between the inside interconnect section 140 and the outside interconnect section 141 as a convenience in drafting when disposing the plurality of interconnects 134, dummy outside connection sections 146 (marked in FIG. 13 by broken lines) are disposed midway in the one interconnect X' and a proper outside connection section 146 (marked in FIG. 13 by solid lines) are disposed midway in the other interconnect Y', so as to be arranged alternately.

In the other interconnect Y', the second interconnect layer 143 is disposed on the column control circuit 30 (display area H) side, with the inside connection section 144 therebetween, and the first interconnect layer 142 is disposed on the terminal 133 (terminal area T) side. That is, the other interconnect Y', moving from the column control circuit 30 side toward the terminal 133 side is connected to the second interconnect layer 143, the inside connection section 144, the first interconnect layer 142, the outside connection section 146, and the third interconnect layer 145, in that sequence.

In the other interconnect Y', the second interconnect layer 143 is connected to the source electrode of the TFT 47 constituting the column control circuit 30. In the other interconnect Y', the second interconnect layer 143 is disposed on a layer below the source electrode of the TFT 47. For this reason, the second interconnect layer 143 is electrically connected to the upper interconnect layer 149 formed on the same layer as the source electrode of the TFT 47, via a contact hole 148 passing through the interlayer insulating film 14, after which it is electrically connected to the source electrode of the TFT 47 via the upper interconnect layer 149. The upper interconnect layer 149 on the surface of the interlayer insulating film 14 is formed of the same material as the source electrode of the TFT 47.

In the other interconnect Y', the first interconnect layer 142 is electrically connected to the third interconnect layer 145 via the outside connection section 146. That is, the outside connection section 146 is electrically connected to the first interconnect layer 142 on the upper layer side and the third interconnect layer 145 on the lower layer side, via a contact hold 146a passing through the interlayer insulating film 14.

In the one interconnect X' and the other interconnect Y', the third interconnect layer 145 is electrically connected to the terminal 133. The terminal 133 includes a lower electrode layer 150, an upper electrode layer 151, and a transparent electrode layer 152.

The lower electrode layer 150 is disposed on the same layer as the third interconnect layer 145. That is, the lower electrode layer 150 on the surface of the gate electrode film 13 is formed using the same material as the third interconnect layer 145.

The upper electrode layer 151 is electrically connected to the lower electrode layer 150 via a contact hole 153 passing through the interlayer insulating film 14. The upper electrode layer 151 over the surface of the interlayer insulating film 14 is formed using the same material as the first interconnect layer 142.

The transparent electrode layer 152 is formed on the surface of the upper electrode layer 151 using the same material as the pixel electrode 6. Although it is not illustrated, a flexible printed circuit (FPC) board is mounted to the terminal 133, with an anisotropic conductive film therebetween.

In the element substrate 102 having the constitution described above, by making the disposition of the first interconnect layer 142 and the second interconnect layer 143 constituting the inside interconnect section 140 different between one interconnect X' and another interconnect Y' of the plurality of interconnects 134 that are neighboring, the interconnect pitch of the inside interconnect section 140 can be narrowed. Because the inside interconnect section 140 includes a second interconnect layer 143 having a sheet resistance that is higher than that of the first interconnect layer 142, the interconnect resistance obtained by lengthening the second interconnect layer 143 can be used as a protective resistance with respect to electrostatic discharge. This enables frame narrowing of the interconnect area L and also enables the achievement of an active matrix substrate that does not require a protective circuit.

In the element substrate 102, between one interconnect X' and another interconnect Y', the first interconnect layer 142 constituting at least a part of the inside interconnect section 140 overlaps with a neighboring second interconnect layer 143. In the element substrate 102, this enables narrowing of the interconnect pitch of the inside interconnect section 140 and the achievement of further frame narrowing of the interconnect area L.

In the element substrate 102, the first interconnect layer 142 is disposed so as to overlap with the neighboring second interconnect layer 143, so that the number of interconnects in the inside interconnect section 140 is smaller than in the outside interconnect section 141. This enables reducing of the apparent number of interconnects 134.

Specifically, in the element substrate 102, between one interconnect X' and another interconnect Y', the first interconnect layer 142 mutually overlaps with the second interconnect layer 143, so that the apparent number of interconnects inside interconnect sections 140 can be reduced to half that of interconnects 134 that are electrically independent. Because the interconnect section 141 does not overlap with the neighboring third interconnect layer 145, the apparent number of interconnects is same as the interconnects 134 that are electrically independent.

In the basic constitution of the interconnects 134 shown in FIG. 13 to FIG. 18, although the description has been simplified to show the plurality of interconnects 134 as straight lines, the actual interconnects 134 are arranged so that the interconnect pitch becomes shorter moving from the display area H side toward the terminal area T side.

Figure 19:
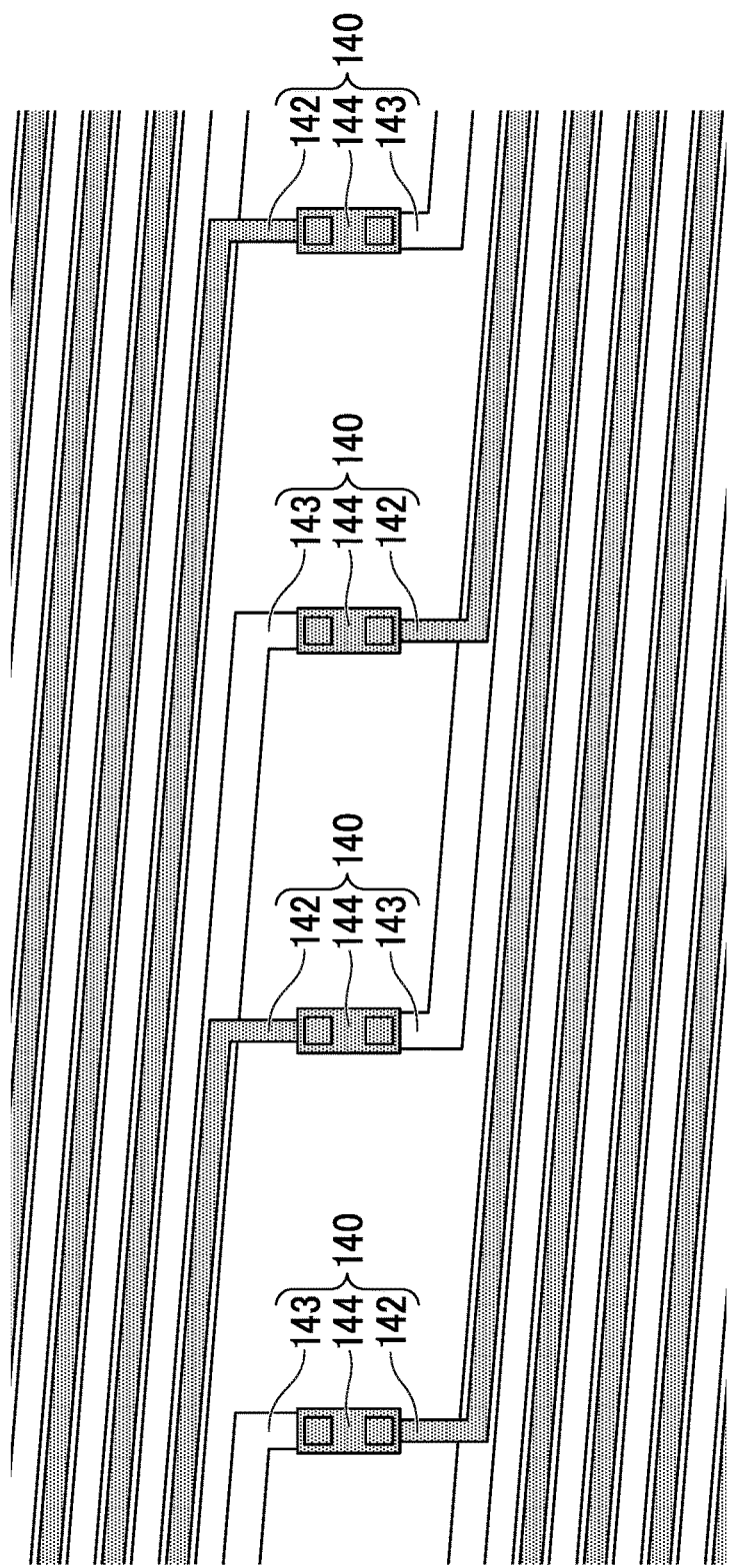
FIG. 19 is a plan view showing the condition of overlapping interconnects.

Therefore, in the element substrate 102, the plurality of interconnects 134 are arranged so that, between one interconnect X' and another interconnect Y', the first interconnect layer 142 actually mutually overlaps with the second interconnect layer 143, as shown in FIG. 19. In this case, in the overlapping part of the first interconnect layer 142 and the second interconnect layer 143, the spacing between one interconnect X' and another interconnect Y' broadens. If the interconnect pitch of the plurality of narrowing fan-in shaped interconnects 134 is made narrowed commensurately because the interconnect 134 has further inclination and, as a results, the proportion that the plurality of interconnects 134 occupy within the interconnect area L can be made small.

<Planar Interconnect Layout>

Figure 20:
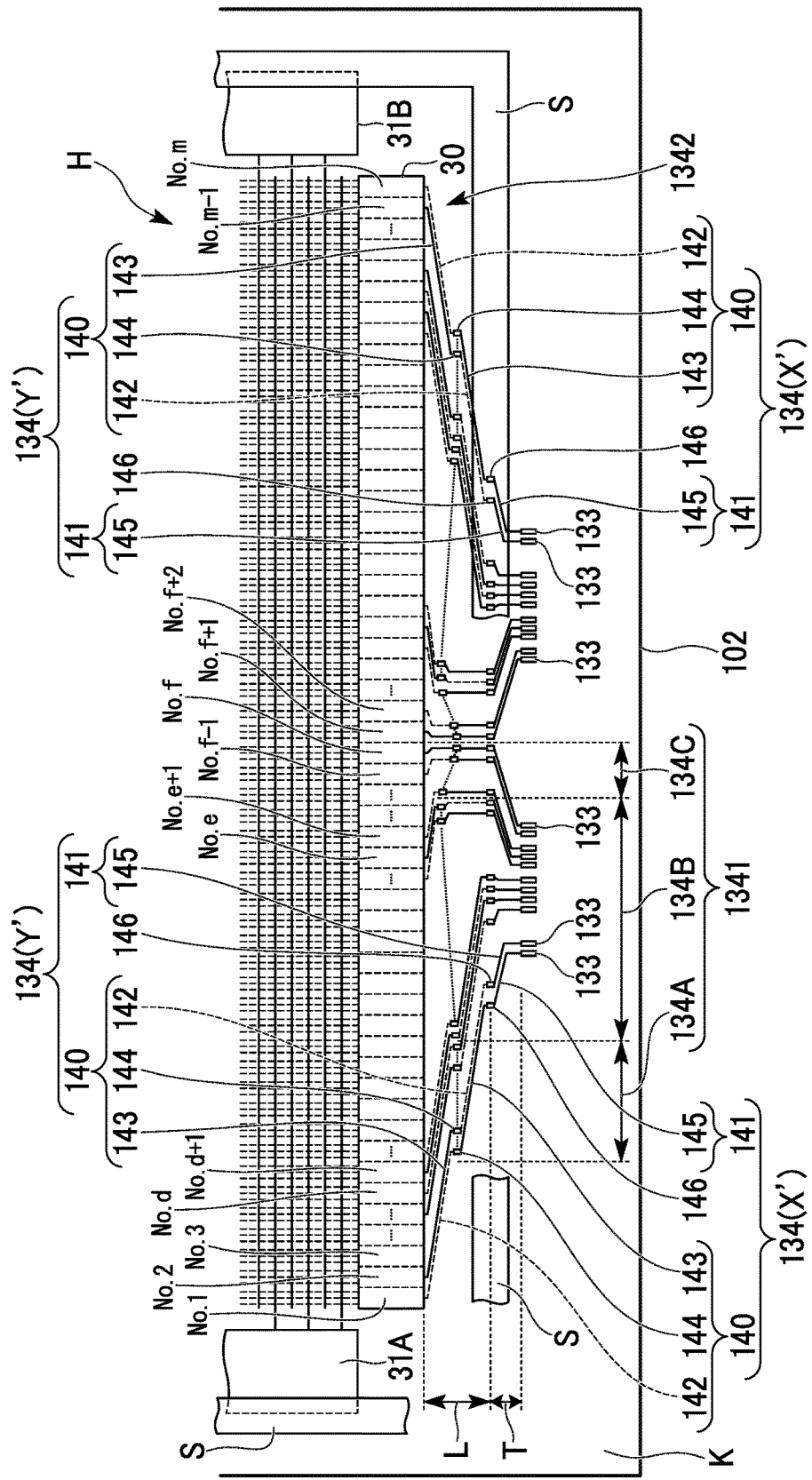
FIG. 20 is a plan view showing the plan-view layout of interconnects of the element substrate, which is the second embodiment.

Next, the planar layout of the plurality of interconnects 134 disposed in the interconnect area L of the element substrate 102 will be specifically described, with reference made to FIG. 20.

In order to describe the planar playout of the plurality of interconnects 134, FIG. 20 is a plan view of the main part centered about the interconnect area L of the element substrate 102.

The plurality of interconnects 134 are arranged so as to be divided into a first interconnect group 1341 and a second interconnect group 1342, which symmetrically sandwich the center part in the arrangement direction thereof (column direction). The first interconnect group 1341 and the second interconnect group 1342 are arranged so that they form a narrowing fan-in shape (with the interconnect pitch becoming shorter) going from the column control circuit 30 side to the terminal 133 side.

Similarly as shown in FIG. 10, the display area H has disposed therein 1080×3 column control lines $D_1$, $D_2$, $D_M$ (where M=3240) and 1920 row control lines $G_1$, $G_2$, ... $G_N$ (where N=1920).

In the terminal area T, m (where m=1080) terminals 133 are disposed in a straight line along the direction of arrangement of the plurality of column control lines $D_1$, $D_2$, ..., $D_M$ (column direction). Of these, in the left-side area about the center part of the terminal area T, m/2 (that is, 540) terminals 133 are arranged in a straight line to match the first interconnect group 1341. Similarly, in the right-side area about the center part of the terminal area T, m/2 (that is, 540) terminals 133 are arranged in a straight line to match the second interconnect group 1342.

In the interconnect area L, m interconnects 134 are disposed along the direction of arrangement of the plurality of column control lines $D_1, D_2, \ldots, D_M$ (column direction). Of these, in the left-side area about the center part of the interconnect area L, the first interconnect group 1341, which includes m/2 interconnects 134, is disposed. Similarly, in the right-side area about the center part of the interconnect area L, the second interconnect group 1342, which includes m/2 interconnects 134, is disposed.

In this case, because the first interconnect group 1341 and the second interconnect group 1342 are positioned symmetrically about the center part of the arrangement direction of the interconnects 134, in the present embodiment, one interconnect group (the first interconnect group 1341 shown in FIG. 20) will be taken as an example to describe the planar layout of the plurality of interconnects 134.

In the first interconnect group 1341, the plurality of interconnects 134 are arranged so that, between the column control circuit 30 and each of the plurality of terminals 133, the plurality of interconnects 134 fans inward (the interconnect pitch becomes shorter) from the column control circuit 30 side toward the terminal 133 side.

Of the plurality of interconnects 134 of the first interconnect group 1341, the inside interconnect section 140 forming one part of the interconnects 134 is arranged so as to remain mutually parallel, the interconnect pitch being maintained from the column control circuit 30 side toward the terminal 133 side. The inside interconnect section 140 forming another part of interconnects 134 is arranged so that the interconnect pitch shortens from the column control circuit 30 side to the terminal 133 side. The outside interconnect section 141 is arranged so that the interconnect pitch shortens from the column control circuit 30 side toward the terminal 133 side. The plurality of interconnects 134 may be constituted so that, rather than including the above-noted inside interconnect section 140 that is arranged in parallel, all the inside interconnect section 140 is arranged so that the interconnect pitch is shortened from the column control circuit 30 side toward the terminal 133 side.

The first interconnect group 1341 includes a first partial interconnect group 134A, a second partial interconnect group 134B, and a third partial interconnect group 134C. Division into the first partial interconnect group 134A, the second partial interconnect group 134B, and the third partial interconnect group 134C is made in view of the differences therebetween in the arrangement directions of the inside connection section 144 among the interconnects 134 belonging each part of interconnect groups 134A, 134B, and 134C.

Of these, the first partial interconnect group 134A, with the left side as shown in FIG. 20 being the 1st, has a total of d interconnects 134, each arranged between the 1st to the d-th column control circuit 30 toward the right side as shown in FIG. 20 and the plurality of terminals 133.

Of this, the second partial interconnect group 134B has a total of (e−d) interconnects 134, each arranged between the (d+1)th to the e-th column control circuit 30 and the plurality of terminals 133.

The third partial interconnect group 134C has a total of (f−e) interconnects 134 each arranged between the (e+1)th to the f-th column control circuit 30 and the plurality of terminals 133.

In the first partial interconnect group 134A, the direction of arrangement of the inside connection section 144 and the direction of arrangement of the plurality of terminals 133 are parallel. The direction of arrangement of the outer connection section 146 and the direction of arrangement of the plurality of terminals 133 are also parallel. Additionally, the spacing in the inside connection section 144 and the spacing in the outside connection section 146 are the same interconnect pitch as the interconnects 134 that are arranged from the column control circuit 30.

Therefore, in the first partial interconnect group 134A, the first interconnect layer 142 or the second interconnect layer 143 that connects between the column control circuit 30 and the inside connection section 144 and the second interconnect layer 143 or the first interconnect layer 142 that connects between the inside connection section 144 and the outside connection section 146 can be extended in the same direction (lower-right direction). In the first partial interconnect group 134A, it is possible to connect from the column control circuit 30 to the outside connection section 146 with the shortest distance. In the first partial interconnect group 134A, between one interconnect X' and another interconnect Y', the first interconnect layer 142 mutually overlaps with the second interconnect layer 143, avoiding the inside connection section 144, outside connection section 146 and the peripheral vicinity.

In the first partial interconnect group 134A, the inside connection section 144 is disposed at a position at which the lengths of the first interconnect layer 142 and the second interconnect layer 143 are equal. This enables, with the first partial interconnect group 134A, the difference in the interconnect resistance of the inside interconnect section 140 between neighboring interconnects 134 to be made small. In particular, this enables, with the first partial interconnect group 134A, the interconnect resistance of the inside interconnect section 140 to be made the same between neighboring interconnects 134.

In the first partial interconnect group 134A, the length of the third interconnect layer 145 (outside interconnect layer 141) that connects between the outside connection section 146 and the terminals 133 varies. That is, the length of the third interconnect layer 145 varies continuously and gradually in accordance with the positional relationship between the outside connection section 146 and the terminals 133. For this reason, the difference in lengths of the third interconnect layer 145 is not a cause of display variations caused by divisions into blocks.

In the second partial interconnect group 134B, the arrangement direction of the inside connection section 144 is not parallel to the arrangement direction of the plurality of terminals 133 but rather at an inclination (in the upper-right direction). For this reason, the inside connection section 144 shifts from the (d+1)th (left side) interconnect 134 toward the e-th (right side) interconnect 134 in the direction approaching the column control circuit 30. In the second partial interconnect group 134B, the spacing of the inside connection section 144 is slightly narrower in the direction of arrangement of the plurality of terminals 133 than the case of the first partial interconnect group 134A.

This enables, in the second interconnect group 134B, the extension of the first interconnect layer 142 or the second interconnect layer 143 that connects between the column control circuit 30 and the inside connection section 144 and the second interconnect layer 143 or the first interconnect layer 142 that connects between the inside connection section 144 and the outside connection section 146 to be extended in the same direction (lower-right direction). In the second partial interconnect group 134B, it is possible to make connection from the column control circuit 30 up to the outside connection section 146 efficiently, while maintaining the interconnect pitch of neighboring interconnects 134. In the second partial interconnect group 134B, between one interconnect X' and another interconnect Y', the first interconnect layer 142 overlaps with the second interconnect layer 143, avoiding the inside connection section 144, outside connection section 146 and the peripheral vicinity.

In the second partial interconnect group 134B, the inside connection section 144 is disposed at a position at which the lengths of the first interconnect layer 142 and the second interconnect layer 143 are equal. In the second partial interconnect group 134B, this enables a continuous change in the sheet resistance without greatly changing the sheet resistance of the inside interconnect section 140 between neighboring interconnects 134. The interconnect pitch of the inside interconnect section 140 can be made narrow.

In the second partial interconnect group 134B, the arrangement direction of the outside connection section 146 and the arrangement direction of the plurality of terminals 133 are parallel. The spacing in the outside connection section 146 is set to be narrower than the spacing in the inside connection section 144 in the first partial interconnect group 134A. Therefore, in the second partial interconnect group 134B, the third interconnect layer 145 (outside interconnect section 141) connecting the outside connection section 146 and the terminals 133 can be extended toward the same direction (lower-right direction) as the inside interconnect section 140. In the case in which, because of the positional relationship between the outside connection section 146 and the terminals 133, the outside connection section 146 is shifted more to the right than the terminals 133, the third interconnect layer 145 (outside interconnect section 141) is extended in the direction that is opposite from the inside interconnect section 140 (lower-left direction).

In the second partial interconnect group 134B, the length of the third interconnect layer 145 that connects between the outside connection section 146 and the terminals 133 varies. That is, the length of the third interconnect layer 145 varies continuously and gradually in accordance with the positional relationship between the outside connection section 146 and the plurality of terminals 133. For this reason, the difference in lengths of the third interconnect layer 145 is not a cause of display variations caused by divisions into blocks.

In the third partial interconnect group 134C, the arrangement direction of the inside connection section 144 is not parallel to the arrangement direction of the plurality of terminals 133 but rather at an inclination (in the lower-right direction). For this reason, the inside connection section 144 shifts from the (e+1)th (left side) interconnect 134 toward the f-th (right side) interconnect 134 in the direction moving away from the column control circuit 30. In the third partial interconnect group 134C, the spacing of the inside connection section 144 is slightly narrower than the case of the first partial interconnect group 134A.

This enables, in the third interconnect group 134C, the extension of the first interconnect layer 142 or the second interconnect layer 143 that connects between the column control circuit 30 and the inside connection section 144 and the second interconnect layer 143 or the first interconnect layer 142 that connects between the inside connection section 144 and the outside connection section 146 to be made in the same direction (lower-right direction). In the third partial interconnect group 134C, it is possible to make connection from the column control circuit 30 up to the outside connection section 146 efficiently, while maintaining the interconnect pitch of neighboring interconnects 134. In the third partial interconnect group 134C, between one interconnect X' and another interconnect Y', the first interconnect layer 142 mutually overlaps with the second interconnect layer 143.

In the third partial interconnect group 134C, the inside connection section 144 is disposed at a position at which the lengths of the first interconnect layer 142 and the second interconnect layer 143 are equal. In the third partial interconnect group 134C, this enables a continuous change in the interconnect resistance without greatly changing the interconnect resistance of the inside interconnect section 140 between neighboring interconnects 134. The interconnect pitch of the inside interconnect section 140 can be made narrow.

In the third partial interconnect group 134C, the length of the third interconnect layer 145 that connects between the outside connection section 146 and the terminals 133 varies. That is, the length of the third interconnect layer 145 varies continuously and gradually in accordance with the positional relationship between the outside connection section 146 and the plurality of terminals 133. For this reason, the difference in lengths of the third interconnect layer 145 is not a cause of display variations caused by divisions into blocks.

Because the second interconnect group 1342 is in a position relationship that is symmetrical to the above-described first interconnect group 1341, the interconnects 134 from the (f+1)th up to the m-th are in positional relationships (planar layout) that are symmetrical to the 1st to the d-th interconnect 134. In this case, the f-th interconnect 134 at the position in the center of the plurality of interconnects 134 and the (f+1)th interconnect 134 are arranged with the same dispositions of the above-described neighboring interconnects X' and Y'. Separate from the symmetrical positional relationship (planar layout) between the first interconnect group 1341 and the second interconnect group 1342, different interconnects X' and Y' may be arranged between the f-th interconnect 134 and the (f+1)th interconnect 134.

<Interconnect Paths>

Next, the different paths of the plurality of interconnects 134 will be divided and described, as shown in FIG. 21, which is a set of plan views showing the plurality of interconnects 134 shown in FIG. 20, classified by path.

The plurality of interconnects 134 can be classified into the paths α', β', γ', δ', and ∈', as shown in FIG. 21. The plurality of interconnects 134 change in form in the sequence of the paths α', β', γ', δ', and ∈', when they are seen in plan view, as the interconnect length is gradually changed. Although the interconnect X' and the interconnect Y' have different positions of the first interconnect layer 142 and the second interconnect layer 143 constituting the inside interconnect section 140, the paths α', β', γ', δ', and ∈' of the interconnects 134 are the same.

Specifically, the path α' is, as the inside interconnect section 140, an interconnect 134 that includes the first interconnect layer 142 and the second interconnect layer 143 that have the same relatively long distances and, as the outside interconnect section 141, an interconnect 134 that includes the third interconnect layer 145 that has a relatively middle-range distance that is shorter than the first interconnect layer 142 and the second interconnect layer 143. The outside connection section 146 is shifted to the left of the terminal 133. In the case of a large screen, in the longest part of the interconnects 134 (the 1st interconnect), there are cases in which the first interconnect layer 142 and the second interconnect layer 143 may have approximately the same interconnect length as the outside interconnect section 141.

In the path α', it is the interconnect layer having a high sheet resistance that contributes to the size of the interconnect resistance, regardless of whether it is an interconnect X' or an interconnect Y'. Therefore, in the path α', the second interconnect layer 143 and the third interconnect layer 145, which have sheet resistances higher than that of the first interconnect layer 142, are included, and the interconnect resistance obtained by the second interconnect layer 143 and the third interconnect layer 145 can be used as a protective resistance with respect to electrostatic discharge.

The path β' is, as the inside interconnect section 140, an interconnect 134 that includes the first interconnect layer 142 and the second interconnect layer 143 that have the same relatively long distances and, as the outside interconnect section 141, an interconnect 134 that includes the third interconnect layer 145 that has a relatively short distance that is shorter than the first interconnect layer 142 and the second interconnect layer 143. The outside connection section 146 is shifted to the left of the terminal 133.

In the path β', it is the interconnect layer having a high sheet resistance that contributes to the size of the interconnect resistance, regardless of whether it is an interconnect X' or an interconnect Y'. Therefore, in the path β', the second interconnect layer 143 and the third interconnect layer 145, which have sheet resistances higher than that of the first interconnect layer 142, are included, and the interconnect resistance obtained by the second interconnect layer 143 and the third interconnect layer 145 can be used as a protective resistance with respect to electrostatic discharge.

The path γ' is, as the inside interconnect section 140, an interconnect 134 that includes the first interconnect layer 142 and the second interconnect layer 143 that have the same relatively long distances and, as the outside interconnect section 141, and that includes the third interconnect layer 145 that has a relatively short distance that is shorter than the first interconnect layer 142 and the second interconnect layer 143. The outside connection section 146 is shifted to the right of the terminal 133.

In the path γ', it is the interconnect layer having a high sheet resistance that contributes to the size of the interconnect resistance, regardless of whether it is an interconnect X' or an interconnect Y'. Therefore, in the path γ', the second interconnect layer 143 and the third interconnect layer 145, which have sheet resistances higher than that of the first interconnect layer 142, are included, and the interconnect resistance obtained by the second interconnect layer 143 and the third interconnect layer 145 can be used as a protective resistance with respect to electrostatic discharge.

The path δ' is, as the inside interconnect section 140, an interconnect 134 that includes the first interconnect layer 142 and the second interconnect layer 143 that have the same relatively middle-range distances and, as the outside interconnect section 141, and that includes the third interconnect layer 145 that has a relatively middle-range distance. The outside connection section 146 is shifted to the right of the terminal 133.

In the path δ', it is the interconnect layer having a high sheet resistance that contributes to the size of the interconnect resistance, regardless of whether it is an interconnect X' or an interconnect Y'. Therefore, in the path δ', the second interconnect layer 143 and the third interconnect layer 145, which have sheet resistances higher than that of the first interconnect layer 142, are included, and the interconnect resistance obtained by the second interconnect layer 143 and the third interconnect layer 145 can be used as a protective resistance with respect to electrostatic discharge.

The path ∈' is, as the inside interconnect section 140, an interconnect 134 that includes the first interconnect layer 142 and the second interconnect layer 143 that have the same relatively short distances and, as the outside interconnect section 141, and that includes the third interconnect layer 145 that has a relatively long distance. The outside connection section 146 is shifted to the right of the terminal 133.

In the path ∈', it is the interconnect layer having a high sheet resistance that contributes to the size of the interconnect resistance, regardless of whether it is an interconnect X' or an interconnect Y'. Therefore, in the path ∈', the second interconnect layer 143 and the third interconnect layer 145, which have sheet resistances higher than that of the first interconnect layer 142, are included, and the interconnect resistance obtained by the second interconnect layer 143 and the third interconnect layer 145 can be used as a protective resistance with respect to electrostatic discharge.

The first partial interconnect group 134A includes the interconnect X' and the interconnect Y' and includes the interconnects 134 of the path α' and the path β' with regard to both the interconnects X' and Y'.

The second partial interconnect group 134B includes the interconnect X' and the interconnect Y' and includes the interconnects 134 of the path γ' and the path δ' with regard to both the interconnects X' and Y'.

The third partial interconnect group 134C includes the interconnect X' and the interconnect Y' and includes the interconnect 134 of the path ∈' with regard to both the interconnects X' and Y.

Therefore, the first interconnect group 1341 includes interconnects 134 of any one of the paths α', β', δ', γ', and ∈'. The lengths of the interconnects 134 constituting the first interconnect group 1341 become shorter going from the path α' to the path ∈', and with regard to the interconnects 134 of the paths δ' and ∈', without traveling over the shortest path between the column control circuit 30 and the terminals 133, by traveling over a long path, it is possible to avoid having the interconnects 134 becoming short.

In particular, an interconnect 134 of the path ∈' is the shortest interconnect 134 among the paths α', β', γ', δ', and ∈'. The interconnect 134 of the path ∈' is constituted by the inside interconnect section 140 including the first interconnect layer 142 or the second interconnect layer 143, which is extended in a direction orthogonal with respect to the direction of arrangement of the plurality of terminals 133, and the outside interconnect section 141, which includes the third interconnect layer 145, which is extended at an inclination with respect to the direction of arrangement of the plurality of terminals 133.

This constitution avoids the shortening of the length of the interconnect 134 in an interconnect 134 of the path ∈'. Making the third interconnect layer 145, which has a high sheet resistance, long results in a sufficient protective resistance with respect to electrostatic discharge.

At this point, the reference path 1' and the reference path 2' shown in FIG. 21 will be described.

The reference path 1' and the reference path 2' are not included in the interconnects 134 of the above-noted element substrate 102.

The reference path 1' is a path in which the first interconnect layer 142 and the second interconnect layer 143 constituting the inside interconnect section 140 and the third interconnect layer 145 constituting the outside interconnect section 141 are connected by the shortest distance. That is, the reference path 1' is the interconnects 134 that include, as the inside interconnect section 140, the first interconnect layer 142 and the second interconnect layer 143, which have the same relatively short distances, and, as the outside interconnect section 141, the third interconnect layer 145 having a relatively short distance.

In the reference path 1', it is the interconnect layer having a high sheet resistance that contributes to the size of the interconnect resistance, regardless of whether it is an interconnect X' or an interconnect Y'. Therefore, in the reference path 1', the second interconnect layer 143 and the third interconnect layer 145, which have sheet resistances higher than that of the first interconnect layer 142, are short, and it is not possible to obtain a sufficient protective resistance with respect to electrostatic discharge.

The reference path 2' has, as the inside interconnect section 140, an interconnect 134 that includes the first interconnect layer 142 and the second interconnect layer 143, which has the same relatively mid-range distance and, as the outside interconnect section 141, the third interconnect layer 145, which has a relatively short distance. However, as shown by the t-th interconnect 234 shown in FIG. 12, the reference path 2' is an interconnect 134 that travels over the shortest path between column control circuit 30 and the inside connection section 144, travels over a bending path between the inside connection section 144 and the outside connection section 146, and travels over the shortest path between the outside connection section 146 and the terminals 133.

In the reference path 2', although the distance from the column control circuit 30 to the terminals 133 is substantially the same as in the path ∈', the lengths of the second interconnect layer 143 and the third interconnect layer 145, which have a sheet resistance higher than that of the first interconnect layer 142, is short. It is therefore not possible to obtain a sufficient protective resistance with respect to electrostatic discharge.

As noted above, in the element substrate 102 of the present embodiment, in the first interconnect group 1341 and the second interconnect group 1342, it is possible to achieve frame narrowing of the interconnect area L without disposing a protective circuit.

That is, in the element substrate 102, because the proportion within the interconnect area L occupied by the first interconnect group 1341 and the second interconnect group 1342 can be made small, the result is that it is possible to achieve frame narrowing of the liquid crystal display panel 101.

Also, in the element substrate 102, of the plurality of interconnects 134, the dispositions of the first interconnect layer 142 and the second interconnect layer 143 constituting the inside interconnect section 140 differ between the one interconnect X' and the other interconnect Y' of neighboring interconnects. This enables the interconnect pitch of the inside interconnect section 140 to be narrowed, without causing a shorts due to foreign matter or the like.

Additionally, in the element substrate 102, the plurality of interconnects 134 are arranged so that the first interconnect layer 142 and the second interconnect layer 143 mutually overlap between the one interconnect X' and the other interconnect Y'. This enables further narrowing of the interconnect pitch of the inside interconnect section 140.

In the first interconnect group 1341 and the second interconnect group 1342, because the interconnect pitch of the plurality of interconnects 134 that are fanned inward, the result is that the proportion within the interconnect area L occupied by the first interconnect group 1341 and the second interconnect group 1342 can be made small. Also, the interconnect resistance of the plurality of interconnects 134 changes continuously between one interconnect X' and the other interconnect Y' of neighboring interconnects. For this reason, variation is not caused in the display of the liquid crystal display panel 101.

In the element substrate 102, the plurality of interconnects 134 is constituted to include any one of the paths α', β', γ', δ', and ∈', and does not include the above-noted path 1' and path 2'. Therefore, it includes the second interconnect layer 143 and the third interconnect layer 145 that have a sheet resistance higher than that of the first interconnect layer 142, and an interconnect resistance obtained by the second interconnect layer 143 and the third interconnect layer 145 can be used as a protective resistance with respect to electrostatic discharge.

In particular, circuit breakdown by electrostatic discharge (ESD) occurs easily in the shortest of the interconnects 134 of the plurality of interconnects 134. As a countermeasure, with regard to the shortest interconnect 134, the constitution can be made so as to have an inside interconnect section 140 that includes the first interconnect layer 142 or the second interconnect layer 143 extended in a direction orthogonal with respect to the direction of arrangement of the plurality of terminals 133 and an outside interconnect section 141 that includes a third interconnect layer 145 extended in a direction at an inclination with respect to the direction of arrangement of the plurality of terminals 133, such as in the above-noted E.

This enables lengthening of the third interconnect layer 145, which has a high sheet resistance, the resulting interconnect resistance being usable as a protective resistance with respect to electrostatic discharge (ESD), enabling the achievement of interconnect area frame narrowing without disposing a protective circuit.

In the element substrate 102, the addition of such an interconnect resistance is achieved not by, for example, a serpentine interconnect, but rather by alternating disposition of the interconnect X' and the interconnect Y', along with measures taken with regard to the interconnects 134. That is, whereas with a serpentine interconnect it is difficult to dispose the interconnects 134 with a narrow pitch, with the element substrate 102, it is possible to add a resistive component even with narrow-pitch interconnects 134. Experiments by the inventor of the present invention verified that, if there is approximately a 500-Ω resistance component in one interconnect 134, it is possible to achieve a withstand voltage of 200 V in an ESD test using the MM method (0 Ω, 200 pF).

With the element substrate 102, because it is not necessary to dispose the above-noted protective circuit 201, it is possible to achieve frame narrowing of the interconnect area L. Therefore, in the above-noted liquid crystal display panel 101, by using the element substrate 2 that has be subject to frame narrowing without requiring a protective circuit 201 such as this, it is possible to accommodate a further increased resolution and reduction in size.

The present invention is not necessarily restricted to the above-described embodiments, and can be subject to various modifications within the scope of the spirit thereof.

Specifically, this will be described regarding variation examples of the element substrates 2 and 102, with reference being made to FIG. 22A to FIG. 22D.

Figure 22A:
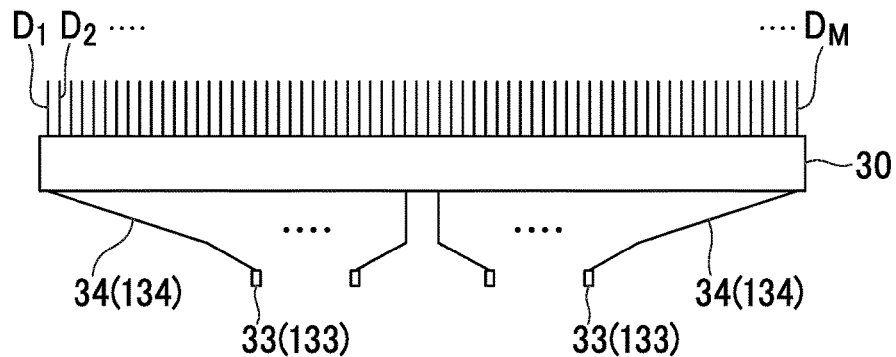
FIG. 22A is a first plan view showing an example of a variation example of the element substrate.

FIG. 22A is a plan view showing, in schematic form, the above-noted element substrates 2, 102. In the element substrate shown in FIG. 22A, the column control circuit 30 is displayed along the direction of arrangement of the plurality column control lines $D_1, D_2, \ldots, D_M$. The column control circuit 30 is a switching circuit (RGB switching circuit) that distributes a signal given from one interconnect to three column control lines with the prescribed timing. The plurality of interconnects 34, 134 are arranged between the column control circuit 30 and each of the plurality of terminals 33, 133. With the element substrate shown in FIG. 22A, because the interconnect resistances of the plurality of interconnects 34, 134 serve as protective resistances with respect to electrostatic discharge, a protective circuit is not necessary.

Figure 22B:
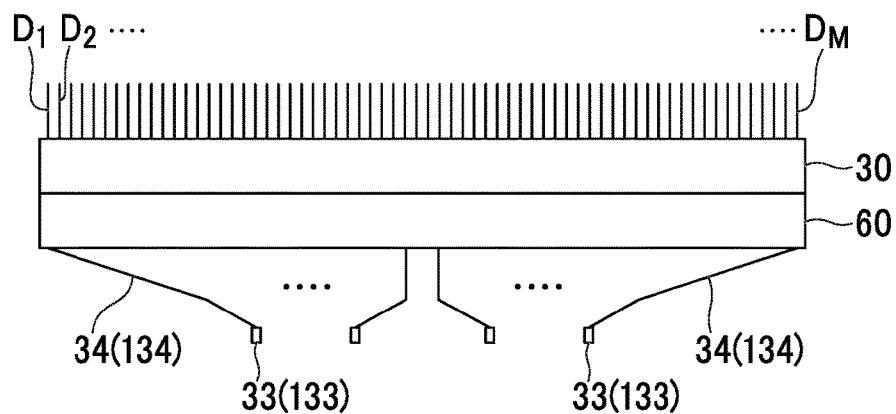
FIG. 22B is a second plan view showing an example of a variation example of the element substrate.

FIG. 22B is a plan view showing, in schematic form, of an element substrate that further has, in addition to the constitution of the element substrates 2, 102, a testing circuit 60 disposed therein. The testing circuit 60 is disposed between the column control circuit 30 and the plurality of interconnects 34, 134, along the column control circuit 30. The plurality of interconnects 34, 134 are arranged between the testing circuit 60 and each of the plurality of terminals 33, 133.

The testing circuit 60 has a switch electrically connected to the interconnects, and has the function of switching a signal input from another path to a proper interconnect within the circuit. This enables a lighting test to be performed of each pixel before mounting the driver IC 35. The testing circuit 60 is formed monolithically on the element substrate.

With the element substrate shown in FIG. 22B, because interconnects 34, and 134 have the same dispositions as in the above-noted element substrates 2, 102 between the testing circuit 60 and the plurality of terminals 33, 133, a protective circuit is not necessary.

Figure 22C:
FIG. 22C is a third plan view showing an example of a variation example of the element substrate.

FIG. 22C is a plan view showing, in schematic form, an element substrate in which the above-noted column control circuit 30 is omitted from the constitution of the above-noted element substrate 2, 102. Interconnects 34, 134 are arranged between the plurality of column control lines $D_1, D_2, \ldots, D_M$ and each of the plurality of terminals 33, 133.

In the element substrate shown in FIG. 22C, although the number of interconnects 34, 134 is three times that in the element substrate shown in FIG. 22A, because the interconnect resistances of the plurality of interconnects 34, 134 serve as protective resistances with respect to electrostatic discharge, a protective circuit is not necessary. Also, in addition to omitting the above-noted column control circuit 30 and driving the column control lines $D_1, D_2, \ldots, D_M$ directly, a constitution can be adopted in which the above-noted row control circuits 31A, 31B are omitted and the row control lines $G_1, G_2, \ldots, G_N$ are driven directly.

Figure 22D:
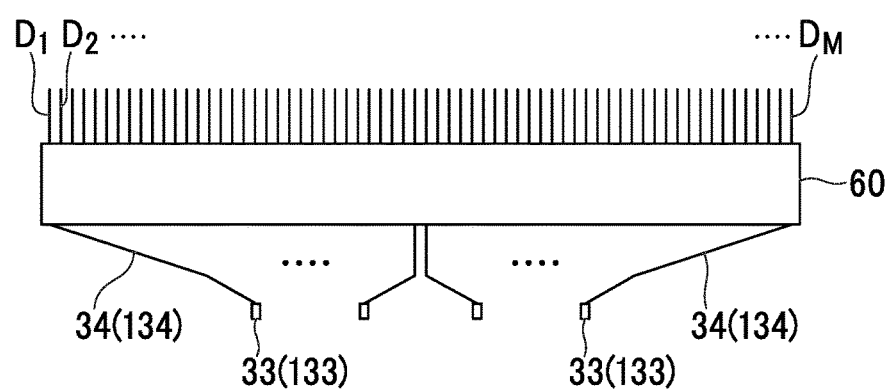
FIG. 22D is a fourth plan view showing an example of a variation example of the element substrate.

FIG. 22D is a plan view showing, in schematic form, an element substrate from which the above-noted column control circuit 30 is omitted from the constitution of the above-noted element substrate 2, 102 and in which the testing circuit 60 is disposed.

In the element substrate shown in FIG. 22D, although the number of interconnects 34, 134 is tripled, the same as in the element substrate shown in FIG. 22C, because the interconnect resistances of the plurality of interconnects 34, 134 serve as protective resistances with respect to electrostatic discharge, a protective circuit is not necessary. Also, in addition to omitting the above-noted column control circuit 30 and driving the column control lines $D_1, D_2, \ldots, D_M$ directly, a constitution can be adopted in which the above-noted row control circuits 31A, 31B are omitted and the row control lines $G_1, G_2, \ldots, G_N$ are driven directly.

In the above-noted embodiments, the constitution shown has been one in which the outside connection section 46 is disposed in a position at which it overlap with the sealing material S when seen in plan view, the width of the sealing material S can be set for each individual model of the liquid crystal display panel 1, 101. Therefore, if the seal material S is widened, disposition may be done so that at least a part of or the entire inside connection section 44 overlaps with the sealing material S when seen in plan view.

In recent years, a manufacturing method has been adopted in which liquid crystal material is dripped on the inside of the sealing material S, which has been formed as a rectangular frame on the surface of the element substrate 2 and then, after the element substrate 2 and the opposing substrate 3 are attached to one another, the sealing material is cured by irradiating it with ultraviolet light. In this manufacturing method, the ultraviolet light passes through the interconnects 34, 134 and strikes the sealing material S.

In this manufacturing method, therefore, the disposition of the interconnects 34, 134 can be set upon predicting the finished width of the sealing material S. For example, if the sealing material S overlaps with a part of the inside interconnect section 140 when seen in plan view, by reducing the apparent number of lines in the inside interconnect section 140 by the overlapping of the above-described first interconnect layer 42 and second interconnect layer 43, it is possible to obtain an area through which the ultraviolet light passes.

In the inside interconnect section 140, the overlapping by one of the interconnect layers 142 and 143 with the column control circuit 30 side and the terminals 133 sandwiching the inside connection section 144 can be determined by considering the finished sealing material S. That is, the first interconnect layer 142 and the second interconnect layer 143 on the column control circuit 30 side that sandwich the inside connection section 144 may be made to overlap or the second interconnect layer 143 and the first interconnect layer 142 on the terminal 133 side that sandwich the inside connection section 144 may be made to overlap.

The above-described overlapping between the first interconnect layer 142 and the second interconnect layer 143 may be in the entire paths thereof or in a part thereof. For example, because it can be envisioned that, if the distance between the overlapped first interconnect layer 142 and second interconnect layer 143 is great the effect obtained from the overlapping is small or none, in that case the region in which there is overlapping may be limited.

If the interconnect area L is shrunk to accommodate frame narrowing, the edge of the sealing material S will approach the column control circuit 30 side. In this case, it is preferable that both the interconnect layers 142 and 143 on the column control circuit 30 side and the terminal 133 side that sandwich the inside connection section 144 be caused to overlap.

The above-noted embodiments have been described regarding a constitution in which, with the number of the plurality of column control lines $D_1, D_2, \ldots, D_M$ and the number of the plurality of interconnects 34, 134 are even, the plurality of interconnects 34, 134 being divided axially symmetrically into the first interconnect group 341, 1341 and the second interconnect group 342, 1342, it is possible to have dispositions wherein the number of the plurality of column control lines $D_1, D_2, \ldots, D_M$ and the number of the plurality of interconnects 34, 134 are odd. In this case, the number of interconnects 34, 134 differs between the first interconnect group 341, 1342 and the second interconnect group 342, 1342 and, although there is not axial symmetry, it is possible to adopt a constitution having such an asymmetrical disposition.

Although in the above-noted embodiments, the constitution shown has been one in which the inside connection section 44, 144 and the outside connection section 46, 146 are simply arranged along an imagined straight line, the present invention is not necessarily restricted in that manner.

In the present invention, the inside connection section 44, 144 and the outside connection section 46, 146 are disposed so that the plurality of interconnects 34, 134 interconnect resistance changes continuously. Stated differently, the inside connection section 44, 144 and the outside connection section 46, 146 are disposed so that the interconnect resistance of the plurality of interconnects 34, 134 does not change non-continuously. Therefore, the inside connection section 44, 144 and the outside connection section 46, 146 may be disposed along some imagined straight line and also so as to zig-zag. If the inside connection section 44, 144 and the outside connection section 46, 146 are disposed so as to zig-zag, the dispositions of the inside connection section 44, 144 and the outside connection section 46, 146 are offset slightly from the ideal positions. However, the magnitude of this offset can be thought of as being sufficiently negligible when compared to the interconnect lengths of the plurality of interconnects 34, 134. Therefore, even if the inside connection section 44, 144 and the outside connection section 46, 146 are arranged so as to zig-zag, because the continuous change in the plurality of interconnects 34, 134 can be maintained, the effect of the present invention is not sacrificed.

Also, although the above-noted embodiments have been described given as an example the element substrate 2, 102 used for a liquid crystal display panel, the display device to which the present invention is applied is not limited to being the above-described liquid crystal display device, and can be, for example, an organic EL display device in which an organic electroluminescent (EL) layer is disposed between an element substrate and an opposing substrate, or an electrophoretic display device, in which an electrophoretic layer is disposed between an element substrate and an opposing substrate.

INDUSTRIAL APPLICABILITY

An embodiment of the present invention can be applied to, for example, an active matrix substrate that, in addition to achieving frame narrowing, does not require a protective circuit with respect to at least one of interconnects arranged between column control lines and terminals and interconnects arranged between row control lines and terminals.

DESCRIPTION OF REFERENCE NUMERALS

1 Liquid crystal display panel
2, 102 Element substrate
3 Opposing substrate
4 Liquid crystal layer
6 Pixel electrode
7 Switching element (TFT)
8 First substrate
30 Column control circuit
31A, 31B Row control circuit
33, 133 Terminal
34, 134 Interconnect
341, 1341 First interconnect group
342, 1342 Second interconnect group
34A, 134A First partial interconnect group
34B, 134B Second partial interconnect group
34C, 134C Three partial interconnect group
40, 140 Inside interconnect section
41, 141 Outside interconnect section
42, 142 First interconnect layer
43, 143 Second interconnect layer
44, 144 Inside connection section
45, 145 Third interconnect section
46, 146 Outside connection section
$D_1, D_2, \ldots, D_M$ Column control line
$G_1, G_2, \ldots, G_N$ Row control line
X, X' One interconnect
Y, Y' Another interconnect
S Sealing material
H Display area
T Terminal area
L Interconnect area

The invention claimed is:

1. An active matrix substrate comprising;
on a substrate,
a plurality of column control lines and a plurality of row control lines that are arranged in directions so as to mutually intersect;
a plurality of switching elements provided so as to correspond to the intersections of the plurality of column control lines with the plurality of row control lines;
a plurality of pixel electrodes connected to each of the plurality of switching elements;
a plurality of terminals provided so as to correspond to at least one of the plurality of column control lines and the plurality of row control lines; and
a plurality of interconnects each arranged between the plurality of column control lines or the plurality of row control lines and the plurality of terminals;
wherein a display area in which the plurality of pixel electrodes are arranged in matrix fashion, a terminal area in which the plurality of terminals are arranged in a line along an edge part of the substrate, and an interconnect area in which the plurality of interconnects are arranged between the display area and the terminal area are provided within the surface of the substrate, and
each of the plurality of interconnects has an inside interconnect section that is arranged on the display area side within the interconnect area and an outside interconnect section that is arranged on the terminal area side within the interconnect area;
and additionally, at least a part of the inside interconnect section is arranged so that the interconnect pitch becomes narrower moving from the display area side toward the terminal area side, and the outside interconnect section is arranged so that the interconnect pitch of the outside interconnect section becoming smaller moving from the display area side toward the terminal area side;
the inside interconnect section includes a first interconnect layer having a first sheet resistance, a second interconnect layer having a second sheet resistance that is higher than the first sheet resistance, and a connection section that connects the first interconnect layer and the second interconnect layer,
the outside interconnect section includes a third interconnect layer connected to either the first interconnect layer or the second interconnect layer, and
of the plurality of interconnects, the second interconnect layer and the third interconnect layer are connected in one neighboring interconnect, and the first interconnect layer and the third interconnect layer are connected in the other neighboring interconnect.

2. The active matrix substrate according to claim 1, wherein the connection section is provided at a position such that the lengths of the first interconnect layer and the second interconnect layer are equal.

3. The active matrix substrate according to claim 1, the plurality of interconnects have a first interconnect group arranged so that the interconnect pitch shortens moving from the display area side toward the terminal area side and a second interconnect group that is neighboring to the first interconnect group and that is arranged so that the interconnect pitch shortens moving from the display area side toward the terminal area side.

4. The active matrix substrate according to claim 1, wherein the shortest of the plurality of interconnects has the inside interconnect section that includes the first interconnect layer or the second interconnect layer extending in a direction perpendicular to the direction of arrangement of the plurality of terminals and the outside interconnect section that includes the third interconnect layer extending in a direction at an inclination with respect to the direction of arrangement of the plurality of terminals.

5. The active matrix substrate according to claim 1, wherein the third interconnect layer has the second sheet resistance.

6. The active matrix substrate according to claim 1, wherein the inside interconnect section is constituted to have the first interconnect layer that is higher than the second interconnect layer, and wherein the plurality of interconnects, when the substrate is seen in plan view, are disposed so that, between one interconnect and another interconnect, the first interconnect layer constituting at least a part of the inside interconnect section overlaps with the neighboring second interconnect layer.

7. The active matrix substrate according to claim 6, wherein the plurality of interconnects are disposed so that, when the substrate is seen in plan view, the first interconnect layer is disposed so as to overlap with the neighboring second interconnect layer, so that the number of interconnects in the inside interconnect sections is smaller than the number of interconnects in the outside interconnect sections.

8. A display device comprising the active matrix substrate according to claim 1.

* * * * *